US011520561B1

(12) United States Patent
Afzal

(10) Patent No.: US 11,520,561 B1
(45) Date of Patent: Dec. 6, 2022

(54) NEURAL NETWORK ACCELERATOR WITH COMPACT INSTRUCT SET

(71) Applicant: Amazon Technologies, Inc., Seattle, WA (US)

(72) Inventor: Tariq Afzal, San Jose, CA (US)

(73) Assignee: Amazon Technologies, Inc., Seattle, WA (US)

( * ) Notice: Subject to any disclaimer, the term of this patent is extended or adjusted under 35 U.S.C. 154(b) by 186 days.

(21) Appl. No.: 16/455,551

(22) Filed: Jun. 27, 2019

Related U.S. Application Data

(60) Provisional application No. 62/772,359, filed on Nov. 28, 2018.

(51) Int. Cl.
| | |
|---|---|
| *G06F 7/544* | (2006.01) |
| *G06F 17/16* | (2006.01) |
| *G06N 3/10* | (2006.01) |
| *G06F 7/57* | (2006.01) |
| *G06F 5/01* | (2006.01) |

(52) U.S. Cl.
CPC ............ *G06F 7/5443* (2013.01); *G06F 5/01* (2013.01); *G06F 7/57* (2013.01); *G06F 17/16* (2013.01); *G06N 3/10* (2013.01)

(58) Field of Classification Search
CPC ...... G06F 7/5443; G06F 17/16; G06F 9/3001; G06F 9/30007; G06F 9/30043; G06F 7/57; G06F 7/575; G06F 17/10; G06F 5/01; G06F 9/30181; G06F 9/30185; G06N 3/06; G06N 3/063
See application file for complete search history.

(56) References Cited

U.S. PATENT DOCUMENTS

| | | | |
|---|---|---|---|
| 7,389,407 B1 * | 6/2008 | Kuslak | G06F 9/3836 712/232 |
| 9,836,691 B1 * | 12/2017 | Narayanaswami | G06N 3/063 |

(Continued)

OTHER PUBLICATIONS

S. Liu et al., "Cambricon: An Instruction Set Architecture for Neural Networks," 2016 ACM/IEEE 43rd Annual International Symposium on Computer Architecture (ISCA), Seoul, Korea (South), 2016, pp. 393-405, doi: 10.1109/ISCA.2016.42. (Year: 2016).*

(Continued)

*Primary Examiner* — Emily E Larocque
*Assistant Examiner* — Carlo Waje
(74) *Attorney, Agent, or Firm* — Kilpatrick Townsend & Stockton LLP

(57) ABSTRACT

Described herein is a neural network accelerator with a set of neural processing units and an instruction set for execution on the neural processing units. The instruction set is a compact instruction set including various compute and data move instructions for implementing a neural network. Among the compute instructions are an instruction for performing a fused operation comprising sequential computations, one of which involves matrix multiplication, and an instruction for performing an elementwise vector operation. The instructions in the instruction set are highly configurable and can handle data elements of variable size. The instructions also implement a synchronization mechanism that allows asynchronous execution of data move and compute operations across different components of the neural network accelerator as well as between multiple instances of the neural network accelerator.

16 Claims, 6 Drawing Sheets

(56) References Cited

U.S. PATENT DOCUMENTS

| | | | | |
|---|---|---|---|---|
| 10,585,973 | B2* | 3/2020 | Tao | G06F 9/30036 |
| 10,643,129 | B2* | 5/2020 | Chen | G06N 3/08 |
| 2002/0073301 | A1* | 6/2002 | Kahle | G06F 9/3846 |
| | | | | 712/235 |
| 2009/0259826 | A1* | 10/2009 | Moore | G11C 8/14 |
| | | | | 712/41 |
| 2014/0173261 | A1* | 6/2014 | Garza | G06F 9/30058 |
| | | | | 712/234 |
| 2015/0052339 | A1* | 2/2015 | Suzuki | G06F 9/3844 |
| | | | | 712/240 |
| 2016/0041851 | A1* | 2/2016 | Bauerle | H04L 29/08108 |
| | | | | 709/224 |
| 2018/0113708 | A1* | 4/2018 | Corbal | G06F 9/30109 |
| 2018/0143835 | A1* | 5/2018 | Whittaker | G06F 9/3818 |
| 2018/0225116 | A1* | 8/2018 | Henry | G06N 3/063 |
| 2018/0307976 | A1* | 10/2018 | Fang | G06N 3/063 |
| 2018/0341484 | A1* | 11/2018 | Fowers | G06F 9/30036 |
| 2019/0026250 | A1* | 1/2019 | Das Sarma | G06F 9/3853 |
| 2019/0065192 | A1* | 2/2019 | Tao | G06F 9/34 |
| 2019/0250915 | A1* | 8/2019 | Yadavalli | G06F 9/30036 |
| 2019/0303749 | A1* | 10/2019 | Appuswamy | G06F 5/01 |
| 2020/0050918 | A1* | 2/2020 | Chen | G06F 7/5443 |
| 2020/0160222 | A1* | 5/2020 | Zhang | G06N 3/02 |
| 2021/0150685 | A1* | 5/2021 | Chen | G06Q 30/0251 |

OTHER PUBLICATIONS

X. Chen and Z. Yu, "A Flexible and Energy-Efficient Convolutional Neural Network Acceleration With Dedicated ISA and Accelerator," in IEEE Transactions on Very Large Scale Integration (VLSI) Systems, vol. 26, No. 7, pp. 1408-1412, Jul. 2018, doi: 10.1109/TVLSI.2018.2810831. (Year: 2018).*

U.S. Appl. No. 16/455,258, "Decompression and Compression of Neural Network Data Using Different Compression Schemes," Filed Jun. 27, 2019.

U.S. Appl. No. 16/455,334, "Neural Network Accelerator With Reconfigurable Memory," Filed Jun. 27, 2019.

U.S. Appl. No. 16/455,381, "Silent Phonemes for Tracking End of Speech," Filed Jun. 27, 2019.

U.S. Appl. No. 16/455,400, "Hybrid Decoding Using Hardware and Software for Automatic Speech Recognition Systems," Filed Jun. 27, 2019.

* cited by examiner

NEURAL NETWORK ACCELERATOR WITH COMPACT INSTRUCT SET

CROSS-REFERENCES TO RELATED APPLICATIONS

This application claims the benefit of and priority to U.S. Provisional Application No. 62/772,359 filed Nov. 28, 2018, entitled "ACE Architecture—NNA." The contents of U.S. Provisional Application No. 62/772,359 are incorporated herein in their entirety for all purposes. The entire contents of the following applications, filed concurrently with the present application, are also incorporated herein by reference for all purposes:
(1) U.S. Non-Provisional application Ser. No. 16/455,258, filed Jun. 27, 2019, titled "DECOMPRESSION AND COMPRESSION OF NEURAL NETWORK DATA USING DIFFERENT COMPRESSION SCHEMES"; and
(2) U.S. Non-Provisional application Ser. No. 16/455,334, filed Jun. 27, 2019, titled "NEURAL NETWORK ACCELERATOR WITH RECONFIGURABLE MEMORY".

BACKGROUND

Computer processors perform various operations on data, including arithmetic operations such as addition, multiplication, and division, and data move operations such as load or store. General purpose processors, such as the central processing unit (CPU) in modern computers, are not specifically designed for certain tasks. For example, the limitations of general purpose processors with respect to graphics computations led to the development of specialized graphics processing units (GPUs).

Neural networks are currently being developed for a wide variety of applications such as image or speech recognition. Neural networks can be executed on general purpose processors using program code written in a specialized programming language such as TensorFlow. The program code is converted into machine instructions by a compiler. In a neural network, the types of computations performed, and the data the computations are performed on, are very different from that used for other applications. For example, neural networks generally involve repeated manipulation of large quantities of data through matrix multiplication, application of a nonlinear function, and other matrix-related operations. General purpose processors are not optimized for performing such operations.

BRIEF DESCRIPTION OF THE DRAWINGS

Various embodiments in accordance with the present disclosure will be described with reference to the drawings, in which.

DETAILED DESCRIPTION

Figure 1:
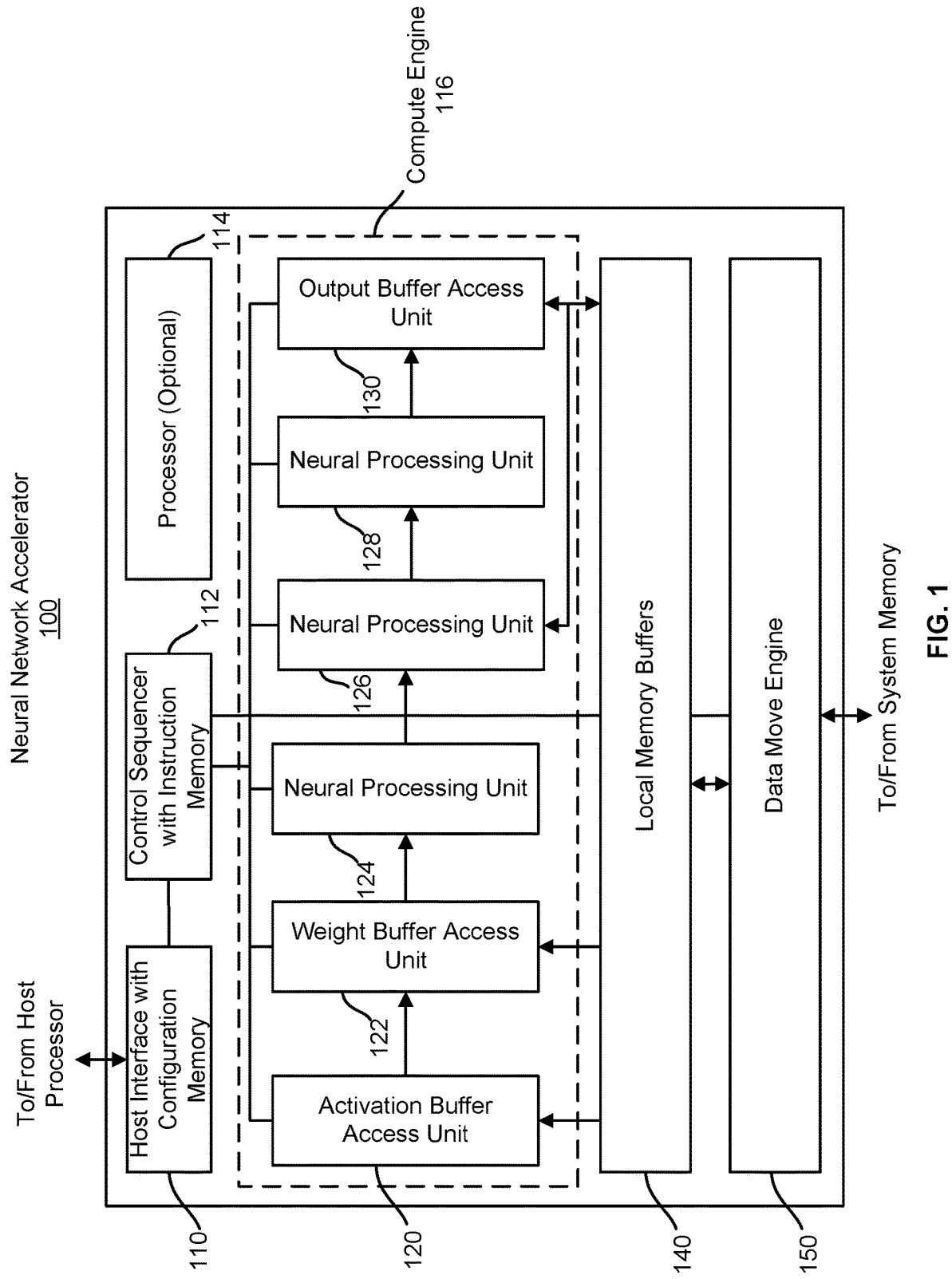
FIG. 1 is a block diagram of an example neural network accelerator, according to certain embodiments.

Embodiments are described herein for a neural network processor, also referred to as a neural network accelerator (NNA), in which the neural network processor is designed to work with an innovative instruction set architecture (ISA). The ISA comprises a compact instruction set with specialized instructions that are highly configurable to enable the instructions to be used for performing various neural network-related tasks. The instruction set is applicable to different types of tasks in different types of neural networks. The instruction set supports various data sizes (e.g., 8-bit or lower weights or activations) and can be used to efficiently perform a sequence of operations with less memory overhead compared to performing the same sequence of operations on a general purpose processor. In certain embodiments, the instruction set supports a synchronization mechanism that enables instructions to synchronize with each other using a predicate register.

In the description herein, various embodiments are described. For purposes of explanation, specific configurations and details are set forth in order to provide a thorough understanding of the embodiments. However, it will also be apparent to one skilled in the art that the embodiments may be practiced without the specific details. Furthermore, well-known features may be omitted or simplified in order not to obscure the embodiments being described.

Neural Network Accelerator Overview

Neural networks are modeled using one or more layers. In a simple neural network, there may be an input layer followed by a hidden layer and then an output layer. A neural network implementation can include multiple hidden layers. Each layer comprises some number of nodes, where each node represents a neuron. A node can be connected to one or more nodes of another layer. The connections represent synapses and are assigned weights. The input layer may receive inputs to the neural network and propagate the inputs to the hidden layer, which in turn performs some computation to propagate the results of the computation to the output layer. The computations are performed by nodes. The input to a node in a hidden or output layer is referred to as an input activation. The output of a node in a hidden or output layer is referred to as an output activation. The output activations of the output layer produce the final results of the neural network and correspond to inferences concerning the inputs supplied to the input layer. An example of a computation that can occur in a node is as follows:

$$y = f\left(\sum_i w_i * x + iv\right)$$

where $w_i$ is a weight, x is an input activation, iv is an initial/bias value, and $f$ is an activation function (e.g., a nonlinear function such as sigmoid or hyperbolic tangent). The example computation above involves computing a weighted sum of input activations multiplied by weights, adding the bias/initial value iv to the weighted sum, and then applying the activation function $f$. The activation function determines the behavior of the output value of the node as a function of the parenthetical term, and may be configured to constrain the output value to a range (e.g., from −1 to +1). Nonlinear functions map the output values onto a shape that is nonlinear, i.e., not a straight line. It is understood, however, that nonlinear functions can provide for an output value range in which at least some portions are linear. For example, rectified linear unit (ReLU) is shaped like two lines that are connected, but with different slope. The weights are typically represented as a vector, where each element of the vector is a weight value. Similarly, the input activations can also be represented as a vector so that the multiplication of the weights with their corresponding input activations is expressed as a dot product. Generally, weights are determined based on training that occurs prior to executing the neural network on actual input, i.e., offline. During training, a set of training inputs are processed through the neural network to adjust the weights based on the results (e.g., inferences) generated using the training inputs.

FIG. 1 is a simplified block diagram of an NNA 100 according to certain embodiments. The NNA 100 comprises a host interface 110, a control sequencer 112, an optional processor 114, an activation buffer access unit 120, a weight buffer access unit 122, a plurality of neural processing units (NPUs) 124, 126, and 128, an output buffer access unit 130, a set of local memory buffers 140, and a data move engine (DME) 150. The activation buffer access unit 120, the weight buffer access unit 122, the NPUs 124, 126, and 128, and the output buffer access unit 130 collectively form a compute engine 116. Along with the control sequencer 112 and the DME 150, the compute engine 116 is responsible for executing instructions. The NNA 100 can be implemented as a standalone computing system or, as shown in FIG. 1, as part of a computing system comprising a host processor and system memory.

The NNA 100 depicted in FIG. 1 is merely an example and is not intended to unduly limit the scope of claimed embodiments. One of ordinary skill in the art would recognize many possible variations, alternatives, and modifications. For example, in some implementations, NNA 100 may have more or fewer components than those shown in FIG. 1, may combine two or more components, or may have a different configuration or arrangement of components.

The NNA 100 generally executes one set of instructions at a time. This set of instructions is referred to herein as a "context." At runtime, the NNA 100 sequences and dispatches, using control sequencer 112, instructions from a pre-compiled context for execution. In certain embodiments, each context comprises a set of instructions that ends with a HALT instruction (described later). Contexts are created by a software compiler. The instructions within a context can implement at least part of a neural network. For example, a context can correspond to a complete layer, a partial layer, or multiple layers of the neural network. In some instances, a context can correspond to a complete neural network (e.g., with instructions for an input layer, a hidden layer, and an output layer).

The host interface 110 is a communication interface to the host processor (not depicted) of the local computing system. The local computing system includes system memory for storing data operated on by the NNA (e.g., weights, activations, and output values corresponding to inferences). The NNA 100 may be communicatively coupled to multiple hosts simultaneously, with any one of the hosts being able to program the NNA 100 to execute neural network-related tasks on behalf of the host. The host interface 110 can communicate with the host processor via a standard communication protocol such as, for example, Advanced eXtensible Interface (AXI) protocol. Similarly, the NNA 100 can include a separate communication interface for communicating with the system memory, e.g., to read and write data from the local memory buffers 140 to the system memory. The communication interface to the system memory is, in certain embodiments, integrated into the DME 150. Thus, the DME 150 can also include an AXI interface.

The control sequencer 112 is responsible for sequencing, dispatching and finishing execution of instructions. Some instructions are executed entirely in the control sequencer 112. Other instructions may be dispatched to one or more of the NPUs 124, 126, and 128 for execution, possibly with execution results being returned to the control sequencer 112 for further processing. Still other instructions are executed by the DME 150 to move data to and from the local memory buffers 140. More than one instruction can be in the execution phase at any given time within the NNA 100. The control sequencer 112 can include an instruction memory into which instructions to be executed by the NNA 100 are downloaded from the host processor or loaded from the system memory.

Figure 4:
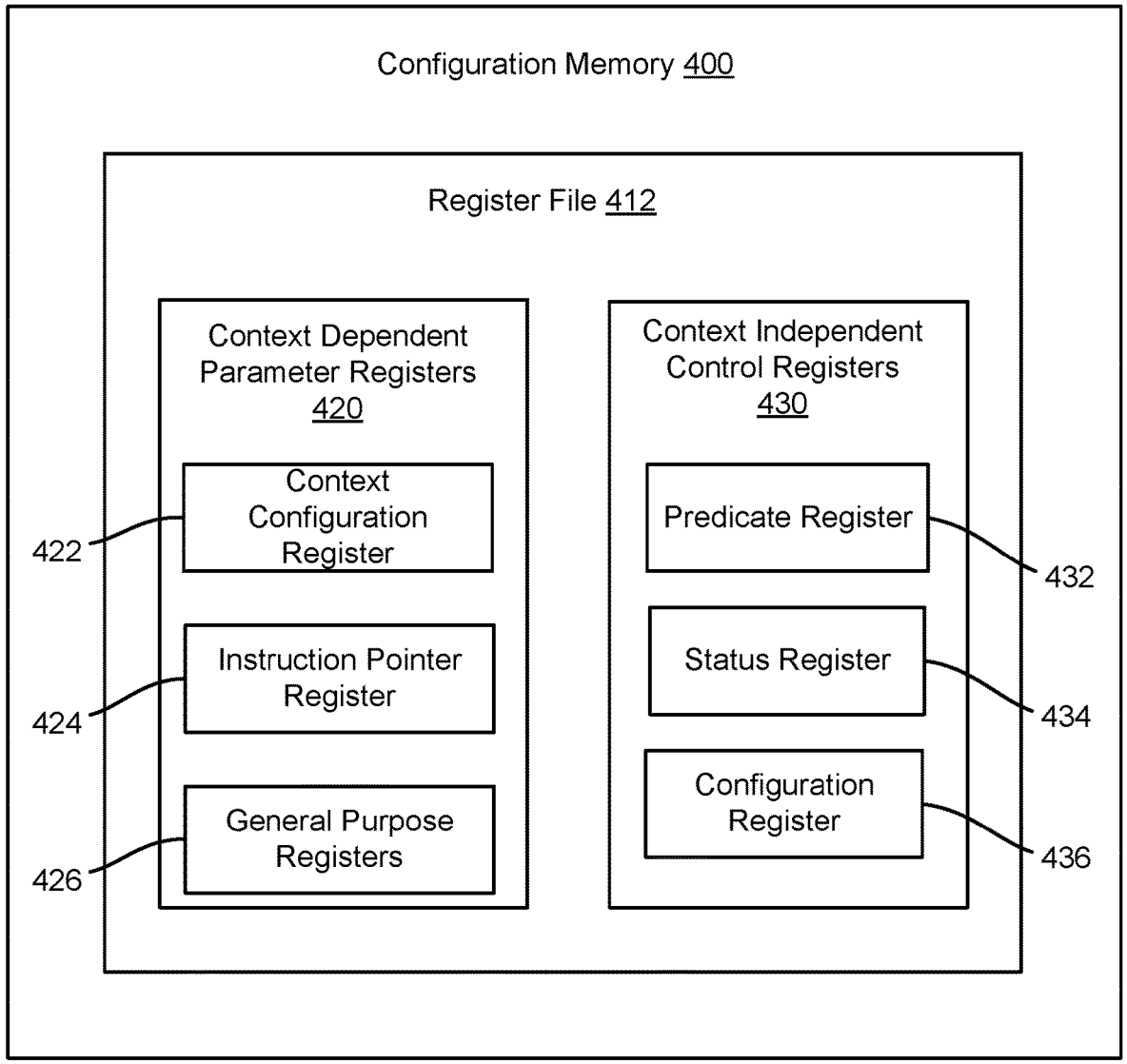
FIG. 4 illustrates an example of a configuration memory within a neural network accelerator, according to certain embodiments.

In the example of FIG. 1, the host interface 110 includes a configuration memory. The configuration memory may include one or more registers that are configurable by the host processor to specify parameters relating to the context to be executed, e.g., various context dependent parameter registers (CDPRs). An example of a configuration memory is shown in FIG. 4.

In certain embodiments, the configuration memory includes a predicate register for synchronizing execution of instructions. Instructions are broadcast by the control sequencer 112 to each component of the compute engine 116 as well as the local memory buffers 140 and the DME 150. Upon receipt of a broadcast instruction, a component may proceed to execute at least part of the instruction in response to determining that the component is capable of handling the instruction. For example, the DME 150 could receive and execute a data move instruction, but the NPUs 124, 126, and 128 could ignore the data move instruction. Because instructions can execute concurrently in different components, it is useful to have a synchronization mechanism to handle any dependencies between instructions. The predicate register can be used to implement such a synchronization mechanism and, in certain embodiments, is a global register visible to internal components of the NNA 100, as well as visible to external entities such as the host processor. Synchronization also helps to prevent conflicts in accessing the local memory buffers 140.

The predicate register may comprise a set of binary semaphores or flags, each corresponding to a single bit that is indexed within the predicate register. Thus, the predicate register can be a register with a plurality of 1-bit entries, each entry having a corresponding index that identifies the entry. Any entity to which the predicate register is visible (e.g., the host) can set or clear individual bits within the predicate register. Certain instructions can be predicated upon the value of one or more bits of the predicated register. For example, an instruction can optionally list a single predicate bit as a condition for starting execution of the instruction. This is represented in a "pred_in" field of the instruction. Additionally, an instruction can optionally list a single predicate bit to mark the completion of the instruction. This is represented in a "pred_out" field of the instruction. In certain embodiments the NNA 100 is part of a computing system with multiple instances of NNA 100, and the predicate register is used to synchronize operations across NNAs. When an instruction that sets a predicate bit is executed by multiple processing units (e.g., the PERCEPT instruction), the processing unit that finishes executing the instruction (e.g., an NPU that generates an output activation according to an activation function) can set the predicate bit.

The processor 114 is an optional general purpose processor for performing certain types of processing in parallel with processing performed by the NPUs 124, 126, and 128. For example, processor 114 may include a floating point unit or other arithmetic logic unit for performing general arithmetic operations in parallel with matrix operations performed by the NPUs 124, 126, and 128.

The activation buffer access unit 120 is configured to access one or more activation buffers in the local memory buffers 140. Similarly, the weight buffer access unit 122 and the output buffer access unit 130 are configured to access one or more weight buffers and one or more output buffers, respectively. The activations stored in the activation buffer(s) correspond to activations produced by one or more layers of a neural network being executed on the NNA 100. The weights stored in the weight buffer(s) are synaptic weights associated with edges between a node of one layer and a node of another layer. Activation and weights are used for certain computations, including for instructions executed by the compute engine 116. The output buffers can store final results or intermediate results (e.g., partial sums) for access by the host processor or the system memory.

The DME 150 is used to bidirectionally move instructions and data between the system memory and NNA local memories (e.g., the activation, the weight, and output buffers that form the local memory buffers 140. The DME 150 can receive data move instructions (e.g., LOAD and STORE instructions) from the control sequencer 112 when such instructions are broadcast. The data move instructions executed by DME 150 can execute concurrently with compute instructions executed by the control sequencer 112 or the compute engine 116. LOAD and STORE instructions can start unconditionally or can be predicated with a binary semaphore in the predicate register. LOAD and STORE instructions can finish unconditionally or set a binary semaphore in the predicate register. A "store finish" predicate is updated when the data being written has reached its destination.

The local memory buffers 140 are used to abstract the physical implementation of memories that form the activation, weight, and output buffers from NNA components (e.g., the compute engine 116 and the DME 150) that access data in these buffers. The data in the activation, weight, and output buffers is accessed through addressing the buffers individually, with the buffer addresses being mapped to the physical addresses of the memories where the data is stored. In certain embodiments, the memories of the local memory buffers 140 are implemented as static random-access memory (SRAM) devices. However, the local memory buffers 140 can be implemented using other types of memory, both volatile and non-volatile (e.g., flash memory, DRAM, resistive RAMs, and the like).

The NPUs 124, 126, and 128 perform numerical operations using the activations and weights stored in the local memory buffers 140. Each NPU is configured to perform all or part of a compute instruction. In certain embodiments, each NPU is capable of executing at least of portion of two types of instructions: PERCEPT and Element Wise Operation (EWOP). PERCEPT involves a series of dot product computations, optionally followed by a non-linear operation. EWOP involves element wise operations on a one-dimensional data vector. Details of PERCEPT and EWOP are discussed later. Although FIG. 1 depicts the NPUs 124, 126, and 128 as block components, the NPUs 124, 126, and 128 are not necessarily identical. For example, as described in connection with FIG. 2, the operations of one NPU may differ from the operations performed by another NPU.

Figure 2:
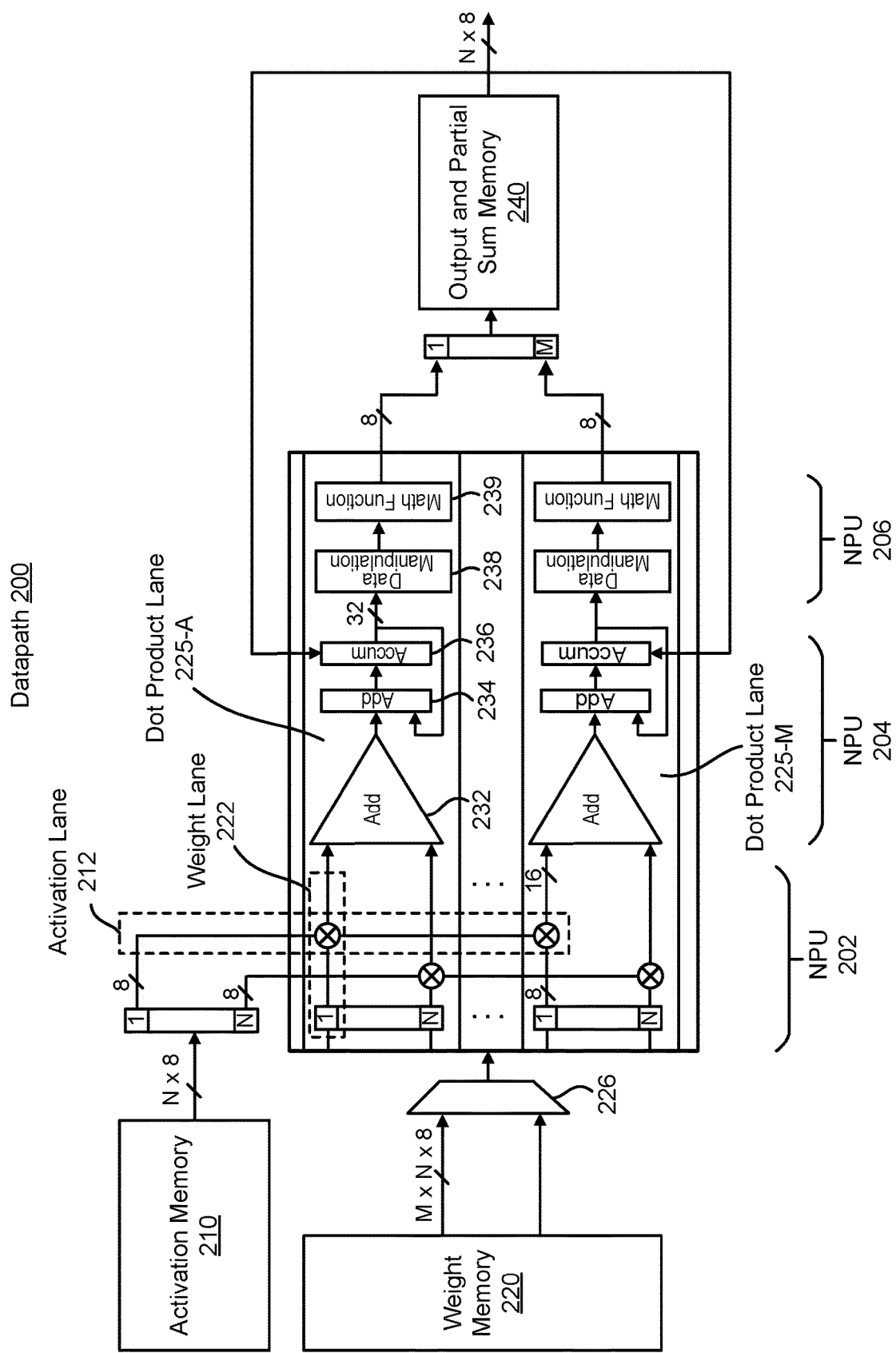
FIG. 2 shows an example datapath for operations performed within a compute engine of a neural network accelerator, according to certain embodiments.

FIG. 2 shows an example datapath 200 for operations performed within a compute engine, e.g., the compute engine 116. In particular, FIG. 2 shows block components that are involved in executing a PERCEPT instruction. As shown in FIG. 2, these block components can be implemented within a plurality of NPUs 202, 204, and 206 that are communicatively coupled to an activation memory 210 and a weight memory 220. The NPUs 202, 204, and 206 are coupled together to form a processing pipeline, and can correspond to the NPUs 124, 126, and 128, respectively. The activation memory 210 and the weight memory 220 may correspond to the activation buffers and the weight buffers in the local memory buffers 140, respectively. In the example of FIG. 2, the processing performed by each NPU 202, 204, and 206 involves M dot product lanes 225 of N inputs each. Two dot product lanes 225-A and 225-N are shown. In FIG. 2, the activations are 8-bit data values, N activations in total being read out of the activation memory 210 to all M dot product lanes 225. Similarly, the weights can be 8-bit data values, N weights per dot product lane 225, for a total of M×N×8 bits of weight data that are read out of the weight memory 220 into a multiplexer 226 for distribution to the dot product lanes 225, with a different set of N weights being supplied to each dot product lane 225. However, in other implementations, the activations and the weights could be represented using a different number of bits. Further, the number of bits used to represent an activation are not necessarily always equal to the number of bits used to represent a weight.

In the example of FIG. 2, although the weights are different for each dot product lane 225, the activation memory 210 is only read once since the same set of N activations is supplied to each dot product lane 225. Thus, the activations are reused M times. The example instruction set described below includes instructions that support different sizes of M and N. For example, the format of the PERCEPT instruction is agnostic to the number of dot product lanes (M) and the number of dot products computed in each lane (N). Thus, the instruction set supports the scalability of different NNA implementations. For instance, in another embodiment, N could be thirty two and the PERCEPT instruction could still be used to execute a matrix multiplication.

Each dot product lane 225 computes N number of dot products between a weight value and an activation value, with the results being summed by an adder 232 for input to an adder 234. The adder 234 computes a running total for input to an accumulator 236, using the current value of the accumulator 236 and the output of the adder 232. As shown in FIG. 2, the NPU 202 can handle computation of the dot products, and the NPU 204 can handle the summation and accumulation.

The accumulator 236 stores intermediate results generated by the adder 234. Intermediate results are often accumulated in the layers of certain types of neural networks, such as fully connected and convolutional layers. To avoid overflow, the accumulator 236 can be implemented with a higher bit width compared to the weights and activations, e.g., 32-bit.

Once the accumulator 236 has completed an accumulation sequence, the result stored in the accumulator 236 can be written to an output and partial sum memory 240 (e.g., an output buffer in the local memory buffers 140) after processing through a data manipulation block 238 that can optionally down shift the output of the accumulator 236, e.g., to an 8-bit value using a quantization algorithm. The data manipulation block 238 can also perform other data manipulations such as applying clipping and/or a scale factor. The output of the data manipulation block 238 is then sent to a math function block 239 that applies an activation function, which can be a nonlinear function (e.g., rectified linear unit (ReLU), hyperbolic tangent (Tanh), or sigmoid). The data manipulation block 238 and the math function block can be implemented by the NPU 206. The outputs of all M math function blocks are then combined into a single vector for transmission to output and partial sum memory 240. The output and partial sum memory 240 may store either output activations (which can be read back into the activation memory 210 for input to a subsequent computation by the same or a different neural network layer) or partial sums that are accumulated. Output activations can, in some embodiments, be transferred directly from the output and partial sum memory 240 into the activation memory 210. Alternatively, the output activations can be temporarily transferred to system memory before loading the output activations into the activation memory 210.

FIG. 2 is merely one example of a datapath through NPUs of a compute engine. Execution of other types of instructions may involve a different datapath, which could be a path through a single NPU or a different combination of NPUs. For example, to perform an elementwise multiplication of a first vector and a second vector (described below in connection with EWOP), the first vector and the second vector could each be read into the NPU 202 in a manner similar to that of the activations in FIG. 2. The NPU 202 could then multiply each element of the first vector with a corresponding element of the second vector, similar to how the activations are multiplied by corresponding weights in FIG. 2. Other types of computations may also be performed by one or more NPUs, including identifying the minimum and maximum values among a first set of data values represented by a first vector and a second set of data values represented by a second vector, an extended multiply add in which a first vector is added to a second vector and the sum multiplied with a third vector (e.g., adding a vector of activations to a vector of weights, and multiplying the sum with a vector of output activations, as described below in connection with EWOP), and other types of operations applicable to data from a vector or matrix. Additionally, certain instructions may be executed, at least in part, by processing units other the NPUs 202, 204, and 206.

Figure 3:
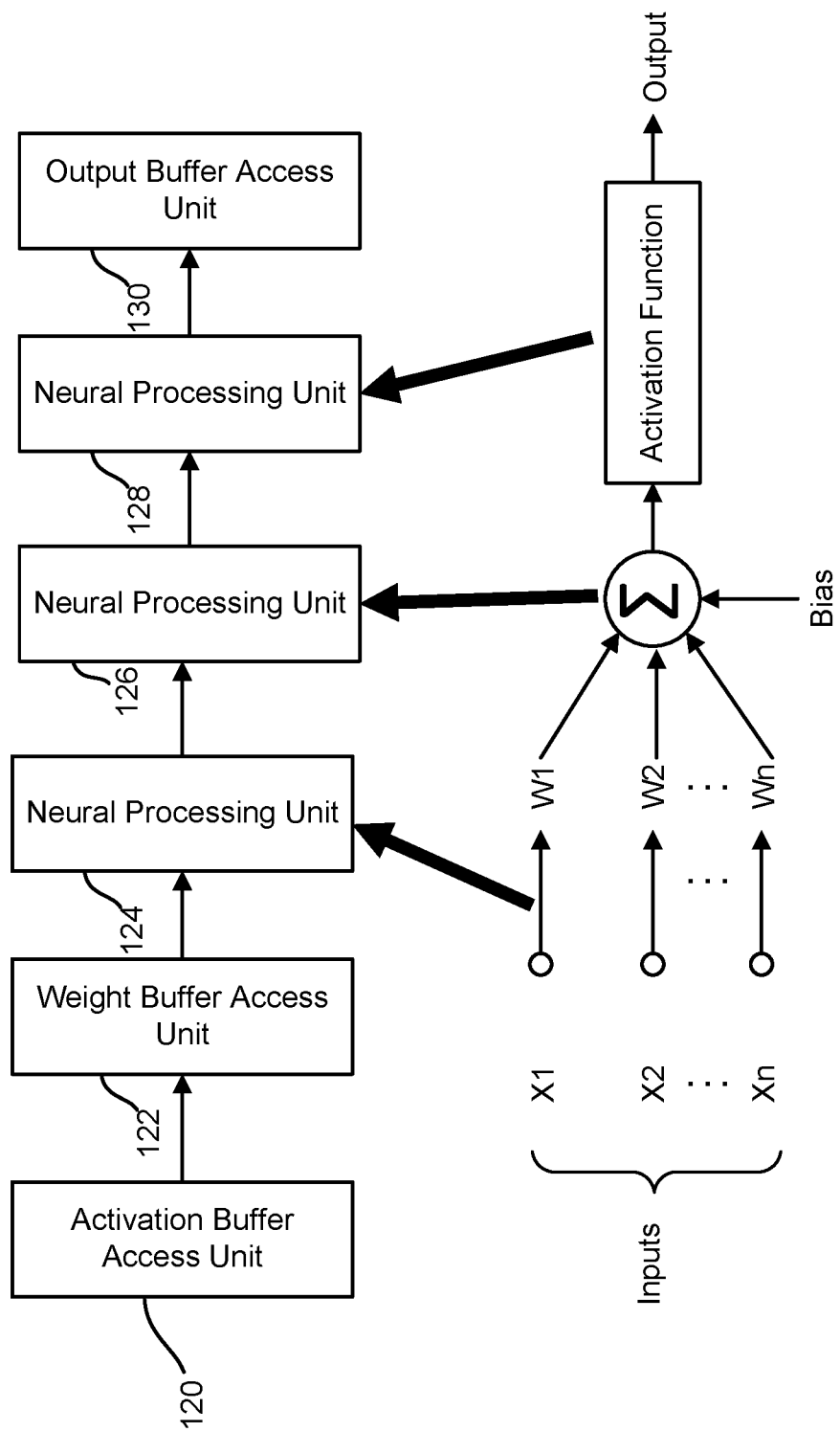
FIG. 3 illustrates an example of processing that can be performed by a compute engine of a neural network accelerator, according to certain embodiments.

FIG. 3 illustrates processing performing by a neuron in a neural network and an example of how the NPUs 124, 126, and 128 in NNA 100 can be used to perform different portions of the processing. As shown in FIG. 3, a set of input values X1 to Xn corresponding to input activations are multiplied by weights W1 to Wn, with the products being summed together along with an initial or bias value. An activation function (e.g., a nonlinear function such as Tanh or sigmoid) is then applied to the sum. The processing depicted in FIG. 3 corresponds to processing described earlier in connection with FIG. 2. In the example of FIG. 3, the multiplication of input values and weights is performed by NPU 124, the summation performed by NPU 126, and the activation function performed by NPU 128. Thus, NPUs 124, 126, and 128 are arranged in a pipelined fashion. Data produced by one NPU can be input directly to the next NPU for performing the next portion of the processing.

FIG. 4 is a simplified block diagram of a configuration memory 400, according to certain embodiments. The configuration memory 400 can be used to implement the configuration memory in FIG. 1, which is part of the host interface 110. However, in other embodiments, the configuration memory 400 or portions thereof can reside elsewhere. The configuration memory 400 comprises a register file 412.

In certain embodiments, the register file 412 is a user register file comprising registers that are accessible (readable and/or writeable) to a host. The register file 412 may comprise context dependent parameter registers (CDPRs) 420 and context independent control registers (CICR) 430. CDPRs 420 can include a context configuration register 422, an instruction pointer register 424, and a set of general purpose registers 426.

Context configuration register 422 is a register that stores context-specific configuration information such as the input scale factor discussed below in connection with the PERCEPT instruction. In certain embodiments, the input scale factor is specified as a log base 2 value. The input scale factor can be applied to scale input data prior to loading the input data into an appropriate NNA buffer (e.g., activation or weight). Scaling can also be applied to intermediate results (e.g., the result of a matrix multiplication, which result is accumulated with results of another matrix multiplication to produce an output activation) prior to further processing to generate the final result (e.g., an output activation) of an instruction. Scaling can be used to reduce the number of bits needed to represent input to the NNA (e.g., from 32 bits to 8 bits). Scaling can also be used to expand the output values produced by the NNA (e.g., from 8 bits back to 32 bits).

Scaling that was performed on weights, activations, or other values prior to processing by the NNA can be reversed whenever knowledge of the fixed-point number format of the scaled values is needed. For example, a weight value of 1.45 can be represented as 145 after scaling by a scale factor of 1/100. When the weight is multiplied by an activation and accumulated, the accumulated result reflects this scaling of the weight. However, in order to properly map the accumulated result according to an activation function such as sigmoid or Tanh, the scaling should be reversed (e.g., by multiplying the accumulated result by the inverse of the scale factor that was applied to the weight). Such rescaling can be performed anytime a value that reflects previous scaling needs to be interpreted.

Instruction pointer register 424 stores a pointer to an address where the next instruction to be executed resides. The pointer can be to a local memory (e.g., an address in the instruction memory) or an external memory (e.g., an address in the system memory).

General purpose registers (GPRs) 426 are registers available for general use during execution of instructions. GPRs 426 can store address pointers to locations of data to be operated on by instructions (e.g., the start address of a set of activations stored in an activation buffer, the start address of a set of weights stored in a weight buffer, or the start address of output activations to be written to an output buffer). The example instructions described below include fields that reference GPRs.

CICRs 430 can include a predicate register 432, a status register 434, and a configuration register 436. The function of predicate registers was described earlier in connection with FIG. 1, and will be described in further detail below in the section on instruction synchronization. In certain embodiments, the predicate register 423 may be part of the control sequencer 112.

The status register 434 can be a read-only register (from the perspective of the host processor) containing information on the status of the NNA 100. The contents of the status register 434 are cleared at the beginning of starting a context and can include various types of status information such as error codes, a pointer to the address of an instruction that caused an error, information on whether the data move engine 150 or any of the local memory buffers are busy, and so on.

The configuration register 436 contains settings that determine various operating modes and configurations for the NNA 100. For example, configuration register 436 can be used to specify whether program code is to be downloaded from a host or loaded from system memory, enable a debugging bus, and enable decompression of input data.

Instruction Synchronization

Instructions executed by NNA 100 can be grouped into three categories: control sequence and management, data movement between the NNA and system memory, and computation instructions. The data movement and computation instructions can run asynchronously and can take many clock cycles (e.g., hundreds) to complete. As mentioned earlier, the instructions are broadcast from the control sequencer 112 to other blocks in the NNA 100 for asynchronous and concurrent execution, with a predicate register being used to synchronize the instructions. The ISA interacts with the predicate register using the pred_in and pred_out fields in the instructions. The pred_in field specifies a predicate register bit that needs to be set in order for the instruction to begin executing. The pred_out field enables the instruction to inform other blocks in the NNA that the instruction has completed, so that any instructions that are pending and dependent on the completed instruction can begin.

The following are example values for pred_in and pred_out:

| Field | Description |
|---|---|
| Pred_in | Predicate index, if any, to start the instruction<br>00000 - unconditional start<br>1iiii - conditional start with iiii index in Predicate Register |
| Pred_out | Predicate index to set, if any, at the end of the instruction<br>00000 - None<br>1iiii - Set iiii index in Predicate Register |

Pred_in set to a value of "0000" (also referred to herein as "pnone") indicates that the instruction can start unconditionally. Pred_in set to "1iiii" indicates a conditional start that is conditioned upon index number "iiii," which corresponds to a semaphore/flag bit in the predicate register. Pred_out set to "0000" indicates that the instruction will not set the predicate register. Pred_out set to "1iiii" indicates that upon completion, the instruction will set index number "iiii" in the predicate register, so that any instruction whose execution is conditioned upon the same index (as specified in the pred_in field of that instruction) can begin. The values of the pred_in and pred_out fields can be set through software, e.g., by a compiler when it generates the program code for the context.

In addition to using the predicate register, a control instruction (i.e., any instruction under the control sequence and management category) can be used to define a synchronization boundary whereby instructions (whether predicated or un-predicated) need to finish execution before the control instruction is started. The ADDR instruction is an exception to this rule.

Example Instruction Set

In certain embodiments, the instruction set used by the NNA 100 comprises the following instructions: LOAD, STORE, SIGNAL, HALT, SETR, ADDR, PERCEPT, and EWOP. Computations are performed using PERCEPT and EWOP. LOAD and STORE are data move instructions. In the example instruction set, the instructions are each 64-bit.

LOAD

LOAD moves a block of data from system memory to a local memory buffer. The load instruction can load one-dimensional (1D) or two-dimensional (2D) data. LOAD has the following fields:

load<pred_in>, <pred_out>, <gpr_src_adr>, <dst_adr>, <num_elem>, <dst_mem>, <mode>, <elm_size>

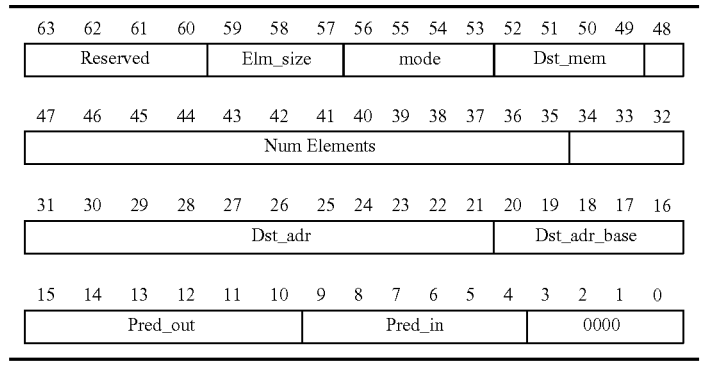

The function of pred_in and pred_out was previously explained. For the sake of brevity, descriptions of similar fields in previously described instructions will not be repeated in the field descriptions of subsequently described instructions. The remaining LOAD fields are described in the following table:

| Field | Description |
|---|---|
| Gpr_adr_base | CDPR[gpr_adr_base][31:0]: Source Memory Address - 8 Byte aligned<br>If mode[3] == 1 or 2D Load<br>Num_elements: Line size/8<br>CDPR[gpr_adr_base + 1][7:0]: Number of Lines + 1<br>CDPR[gpr_adr_base + 1][23:8]: Skip 8-bytes |
| Dst_adr | Destination address in NNA local memory - 8-byte aligned |
| Num_Elements | Number of elements to transfer/8<br>For load to CMAP, it is just the number of elements |
| Dst_mem | Destination Memory<br>An implementation may not implement all buffers listed below: |

| Memory Buffer | Value |
|---|---|
| Activation Buffer 0 | 0 |
| Activation Buffer 1 | 1 |

| Field | Description | |
|---|---|---|
| | Synaptic Weight Buffer 0 | 2 |
| | Synaptic Weight Buffer 1 | 3 |
| | Output Buffer 0 | 4 |
| | Output Buffer 1 | 5 |
| | Compression Map Buffer | 6 |
| | Shared Weight LUT | 7 |
| | Non Linear Coefficients | 8 |
| | Reserved for hardware internal use | 10-15 |
| mode | Transfer Mode | |
| | mode[0] - 0: local address linear increment | |
| | 1: local address banked increment | |
| | This mode only effects when destination memory is set to one of the Synaptic Weight Buffers | |
| | mode[1] - 0: No decompression using CMAP buffer | |
| | 1: Decompress using CMAP buffer | |
| | mode[2] - 0: No decompression using Lookup table | |
| | 1: Decompress using Lookup table | |

| Field | Description |
|---|---|
| | Mode[3] - 0: NONE |
| | 1: Load 2D Data. 2D Load parameters come from num_elements and gpr_adr_base + 1 register |
| Elm_size | Element Size: Size of the packed vector element |
| | 0: 1-bit |
| | 1: 2-bits |
| | 2: 3-bits |
| | 3: 4-bits |
| | 4: 5-bits |
| | 5: 8-bits |

The Gpr_adr_base field has different meanings depending on the instruction in which this field is included. In the case of LOAD instructions, Gpr_adr_base is the base address for a context dependent parameter register that indicates the source address for the load in system memory. Dst_adr is a destination address in the local memory buffers for the data being loaded. Num_Elements indicates the number of data elements being loaded. Note that the size of the data elements is not specified in this field since the data size can vary (e.g., sub-byte loads). The value of Dst_mem indicates which local memory buffer (e.g., an activation buffer, weight buffer, or output buffer) is being loaded. The mode field can be set to indicate whether the load is for 1D data (e.g., vectors) or 2D data (e.g., matrices), as well as to indicate whether the data being loaded should be decompressed, using an internal compression map (CMAP) buffer, for storage in the destination memory. The element size field specifies the size of the data elements being loaded, which in this example can range from 1-bit to 8-bits. Thus, the LOAD instruction supports sub-byte (less than eight bits) loads. For 2D loads, the gpr_adr_base+1 register can be set to indicate how many lines of data to load (e.g., the total number of rows in a 2D matrix) and how much far away the next line of data is (e.g., the total number of bytes in a row).

Store

STORE moves a block of data from a local memory buffer to system memory. The pred_out field of a STORE instruction is updated when the all the data being stored has reached its destination. STORE operates a manner complementary to LOAD and, in certain embodiments, can support similar features including, for example, storage of sub-byte data elements and storage of 2D data. Thus, STORE may include additional fields not shown below (e.g., a mode field and an Elm_size field). In certain embodiments, STORE has the following fields:

store <pred_in>, <pred_out>, <gpr_dst_adr>, <src_adr>, <size>, <src_mem>

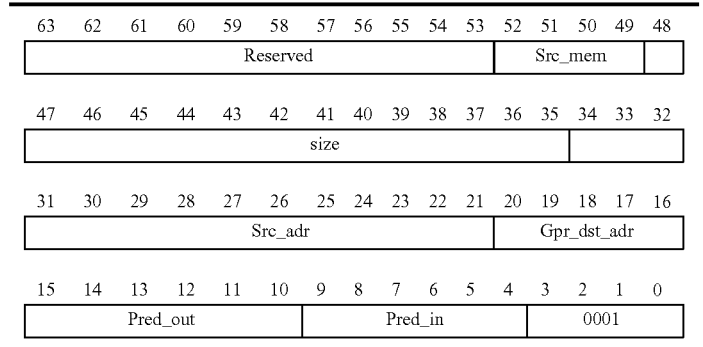

| Field | Description |
|---|---|
| Gpr_dst_adr | CDPR for Destination System memory address - 8-byte aligned |
| Src_adr | Source address in NNA local memory - 8-byte aligned |
| Size | Transfer size in 8-byte granules |
| Src_mem | Source Memory An implementation may not implement all buffers listed below: |

| Memory Buffer | Value |
|---|---|
| Reserved | 0-3 |
| Output Buffer 0 | 4 |
| Output Buffer 1 | 5 |
| Reserved | 7-15 |

Percept

As mentioned earlier in connection with FIG. 3, processing corresponding to that of a neuron can be performed in a pipelined fashion using NPUs 124, 126, and 128. This pipelined execution is advantageous compared to performing the same computations on a general purpose processor. If executed on a general purpose processor, each of the three phases (multiplication plus summation, bias, and activation function) would involve a separate memory access. In NNA 100, all three phases are performed in-line, with the results of one phase being passed directly to the next. Essentially, three operations are fused into a single operation for execution on the NPUs 126, 126, and 128. The PERCEPT instruction can be used to specify the details of this fused operation. In particular, PERCEPT can implement the general matrix multiply functionality:

$$y = f\left(\sum_i w_i * x + iv\right)$$

Where y is an output value generated by applying a nonlinear function $f$ to a sum of products and an initial/bias value iv, and where the products are weights W, multiplied by activations x. The bias value and the nonlinear function are optional.

PERCEPT has the following fields:
percept <pred_in>, <pred_out>, <size>, <gpr_adr_base>, <isfv>, <ivsl>, <output_scale_factor>, <mbi>, <nlin>, <acc_init>,<acc_out>,<odpos>,<adpos>, <repeat>

| 63 | 62 | 61 | 60 | 59 | 58 | 57 | 56 | 55 | 54 | 53 | 52 | 51 | 50 | 49 | 48 |
|----|----|----|----|----|----|----|----|----|----|----|----|----|----|----|----|
| repeat | | | | adpos | | | | | odpos | | | Acc_out | | Acc_init | |

| 47 | 46 | 45 | 44 | 43 | 42 | 41 | 40 | 39 | 38 | 37 | 36 | 35 | 34 | 33 | 32 |
|----|----|----|----|----|----|----|----|----|----|----|----|----|----|----|----|
| nlin | | | mbi | | | Output_scale_factor | | | | | ivsl | | | isfv | |

| 31 | 30 | 29 | 28 | 27 | 26 | 25 | 24 | 23 | 22 | 21 | 20 | 19 | 18 | 17 | 16 |
|----|----|----|----|----|----|----|----|----|----|----|----|----|----|----|----|
| Gpr_adr_base | | size | | | | | | | | | | | | | |

| 15 | 14 | 13 | 12 | 11 | 10 | 9 | 8 | 7 | 6 | 5 | 4 | 3 | 2 | 1 | 0 |
|----|----|----|----|----|----|---|---|---|---|---|---|---|---|---|---|
| Pred_out | | | | | | | Pred_in | | | | | 0011 | | | |

| Field | Description |
|---|---|
| Size | Size of input activation in 8-byte granules - zero base |
| Gpr_adr_base | Even address of the CDPR register pair<br>0 - illegal, 1 - CDPR[2], 2 - CDPR[4]<br>CDPRs memory buffer address pointers - 8-byte aligned, 16-bit wide<br>CDPR[gpr_adr_base][15:0]: Activation memory start address<br>CDPR[gpr_adr_base][31:16]: Synaptic memory start address<br>CDPR[gpr_adr_base + 1][15:0]: Output memory write address<br>CDPR[gpr_adr_base + 1][31:16]: Output memory read address |
| Isfv | Input Scale Factor valid |
| Ivsl | Accumulator initial value shift left amount<br>Valid only when Acc_init == 1<br>To use ivsl, size field needs to be at least 1 |
| Output_scale_factor | Output Scale factor (5-bit unsigned fraction)<br>Non-linear activation functions cannot be used with output_scale_factor<br>Output_scale_factor of 0x1f is treated as 1 |
| MBI | Memory Buffer Index<br>MBI[0] Synaptic Buffer Index<br>MBI[1] Activation Buffer Index<br>MBI[2] Output Buffer Index |
| Nlin | Non-Linear Function<br><br>Function — Value<br>None — 0<br>RELU — 1<br>SIGMOID — 2<br>TANH — 3<br>Reserved — 4-7 |
| Quantization Threshold | For acc_out == 2, nlin field is interpreted as Saturation Threshold<br>Threshold_base (Thb) = 1 << (7 − odpos)<br>Threshold represents the integer portion of the accumulator<br><br>Threshold value — Quantization Threshold Interpretation<br>0 — Do not saturate<br>1 — \| Thb \|<br>2 — \| Thb + Thb/2 \|<br>3 — \| 2 * Thb \|<br>4 — \| 3 * Thb \|<br>5 — \| 4 * Thb \|<br>6 — \| 8 * Thb \|<br>7 — \| 32 * Thb \| |
| Acc_init | Accumulator Initialization<br>0: initialize to zero<br>1: load 8-bit value from Output buffer<br>2: load 32-bit value from Output buffer<br>3: Reserved |
| Acc_out | Export Accumulator<br>0: 8-bit output |

-continued

| Field | Description |
|---|---|
| | 1: 32-bit output |
| | 2: 8-bit output with clip and scale |
| | 3: 8-bit output with clip, scale and Relu activation |
| | To use acc_out 32-bit, size field needs to be at least 3 |
| | For clip, see nlin field |
| Odpos/log2(wfact)/ Clip Thresdold | Output Decimal Position |
| | Indicates the position of decimal point in the output. A value of 0 would indicate an all integer output. Odpos field is only interpreted when the output is 8-bits |
| | 0: 1 (sign) 7 (integer) |
| | 7: 1 (sign) 7 (fraction) |
| | If the nlin function is set to Sigmoid or Tanh, then this field doubles up as log2(weight_scale_factor) |
| | Odpos field is also used for determining clipping threshold value. See Nlin field |
| adpos | Accumulator Decimal Position |
| | Indicates the position of decimal point in the internal 32-bit Accumulators |
| Repeat | Repeat count + 1 for the instruction |
| | For repeated instructions: |
| | Pred_in is incremented by 1 from last invocation |
| | Pred_out is incremented by 1 from last invocation |
| | Output memory buffer address is incremented by size |

The size field indicates the number of input activations to be summed and corresponds to the size of an activation buffer. PERCEPT can be executed upon the entire contents of the activation buffer, which in a typical neural network could include thousands of activations. The computations can therefore involve many multiply-accumulate operations that take hundreds of clock cycles to complete. Depending on the amount of memory available in the NNA, the computations may have to be split into multiple PERCEPT instructions that compute partial products, with a nonlinear function being applied during the final PERCEPT.

Gpr_adr_base, in the case of a PERCEPT instruction, indicates the addresses where the three vectors (weight, input activation, and output activations) being operated on are located in the local memory buffers. As indicated in the field description above, the starting addresses of the weights, input activations, and output activations are contained in CDPRs whose indices are identified by a base address corresponding to the value of GPr_adr_base.

Isfv stands for input-scale-factor-valid and is used to indicate scaling of input activations, e.g., scaling from 32-bits down to 8-bits. The scale factor can be set via an input scale factor field in a context configuration register, and can be changed on a frame-by-frame basis, where each frame is a unit of input data to be processed through a neural network by sending the input data to the input layer of the neural network. For example, when running a neural network on speech input, each second of audio could be divided into one hundred frames, each frame being processed through a separate execution of the neural network, and multiple PERCEPT instructions being used to process the entire set of one hundred frames. Certain frames, for example frames during which there is silence, may require less scaling that others. Scaling can also be applied to weights (indicated, e.g., by the Odpos field) and output activations (indicated, e.g., by the Output_scale_factor field). Scaling of weights can be performed offline, e.g., by the host processor, prior to loading the data into local memory buffers. Scaling of input activations and output activations can be performed within the NNA during runtime.

Ivsl stands for initial-value-shift-left and is used to set the initial value of the accumulator through left shifting by an amount indicated by the value of Ivsl.

Output_scale_factor scales output activations. Output scaling is performed at runtime within the NNA and can be used, for example, to increase the number of bits used to represent the output activations.

In certain embodiments, scaling is performed through quantization. Quantization refers to the process of reducing the number of bits that represent a number. In the context of deep learning, the predominant numerical format is 32-bit floating point (FP32). However, research has demonstrated that weights and activations can be represented using 8-bit integers (INT8) without incurring significant loss in accuracy. Even lower bit-widths, such as 4-bit, 2-bit and 1-bit, may also be feasible. Reducing the number of bits used to represent weights or activations enables computations using the weights or activations to be performed faster.

In certain embodiments, a symmetric linear quantization scheme is used to map 32-bit floating points to 8-bit integers as follows:

$$FP32(T)=\text{scale\_factor}(sf)*8\text{-bit Tensor}(t)$$

The scaling factor sf is the scaling factor for each tensor in each layer of the neural network, and can correspond to an input activation scale factor, a weight scale factor, or an output activation scale factor. One way to determine the scaling factor sf is to compute a scale factor that maps the minimum value of the tensor to an integer value of −127 and the maximum value of the tensor to an integer value of 127. Other quantization schemes can also be used.

MBI is a memory buffer index indicating which weight, activation, and output buffers the PERCEPT instruction will use.

Nlin indicates which nonlinear function, if any, to apply. In certain embodiments, sigmoid, Tanh, and ReLU are available through the instruction set and are implemented in hardware. However, other nonlinear functions can also be implemented, for example, in software executed by a general purpose processor such as the processor 114 in FIG. 1.

Acc_init indicates whether the accumulation process should begin at some initial value (e.g., an 8-bit or 32-bit value representing an output activation stored in an output buffer) instead of from zero.

Acc_out indicates the size for the output values of the accumulation process, e.g., 8-bit or 32-bit, with options for scaling, clipping, and activation.

Adpos indicates the decimal position for the output of the accumulator. This field is used to control which portion of the output corresponds to an integer and which portion corresponds to a fraction.

Odpos indicates the decimal position for the output of the PERCEPT instruction. In some instances, Odpos indicates a weight scale factor. For example, as indicated in the description of the Odpos field above, when PERCEPT is configured to apply a sigmoid or Tanh function, the value of Odpos corresponds to the log base 2 of the weight scale factor. When sigmoid or tanh is being performed on accumulated results that were computed using scaled weights, indicating the weight scale factor through the Odpos field enables the accumulated results to be properly interpreted for input to the sigmoid or Tanh operation. For example, the processing unit that applies the sigmoid or Tanh can rescale the accumulated results using an inverse scale factor before mapping the rescaled accumulated results to output values.

Repeat is used to create a loop in which the PERCEPT instruction is repeated a certain number of times. This is useful in situations where the input data fits into a single PERCEPT instruction, but PERCEPT is unable to produce the output data all at once. For example, in each iteration of the loop, PERCEPT may be limited to producing output for eight neurons, i.e., eight output activations. To produce additional activations, the repeat field can be set to create a loop that repeats the PERCEPT instruction on data at an updated address pointer. The address pointer can be updated, for example, by changing the base address Gpr_adr_base to point to a different CDPR that contains a new address pointer or by updating the address pointer in a CDPR according to where the last iteration of the PERCEPT instruction left off. As an example, a PERCEPT can be repeated using the same activations on a new set of weights or using the same set of weights on a new set of activations.

EWOP

Elementwise operations include operations in which the same operation is repeated between corresponding elements of two vectors. For example, an elementwise subtraction between a first vector and a second vector involves computing the first element of an output vector as the difference between the first element of the first vector and the first element of the second vector, computing the second element of the output vector as the difference between the second element of the first vector and the second element of the second vector, and so on. Elementwise operations can also be performed between a vector and a scalar value, by applying the scalar value to each element of the vector. For example, a third vector may be formed by reusing the scalar value for each element of the third vector. The same operations discussed above with respect to the first vector and the second vector could then be performed between the first vector and the third vector or between the second vector and the third vector.

EWOP is an elementwise vector operation that takes one, two, or three input vectors, performs a unary, binary, or a ternary operation on them, and produces one or two output vectors. Thus, up to five local memory buffers (three input and two output) may be used in an EWOP instruction. Like PERCEPT, the EWOP instruction is not limited to input data of fixed size, but can be used on data of different sizes. The input data for EWOP comprises vectors from the activation or weight buffer. Input and output vectors have the same size. EWOP has the following fields:

ewop <pred_in>, <pred_out>, <size>, <gpr_act_adr>, <gpr_syn_adr>, <gpr_out_adr>, <func1>, <func2>, <op1>, <op2>, <mbi>

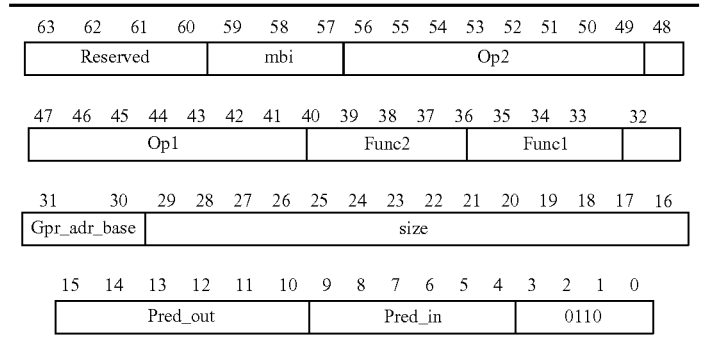

| Field | Description |
|---|---|
| Func1 | Primary Function |
| Func2 | Secondary Function |
| Op1 | Operand 1 |
| Op2 | Operand 2 |

The size, Gpr_adr_base, and mbi fields have the same meaning as in PERCEPT. Func1 and Func2 are fields for primary and secondary functions that define the operation to be performed on the input vector(s):

| Primary Function (Func1) | Secondary Function (Func2) | | Op1 | Op2 | Comments |
|---|---|---|---|---|---|
| 0: SADD | 0 | Vec-vec | — | — | Out[n] = actb[n] + synb[n] |
| | 1 | Vec-scalar | Scalar | — | Out[n] = actb[n] + Scalar |
| | 2 | scalar-vec | Scalar | — | Out[n] = Scalar + synb[n] |

-continued

| Primary Function (Func1) | Secondary Function (Func2) | | Op1 | Op2 | Comments |
|---|---|---|---|---|---|
| 1: SSUB | 0 | Vec-vec | — | — | Out[n] = actb[n] − synb[n] |
| | 1 | Vec-scalar | Scalar | — | Out[n] = actb[n] − Scalar |
| | 2 | scalar-vec | Scalar | — | Out[n] = Scalar − synb[n] |
| 2: MULT | 0 | Vec-vec | — | Shfamt Rng[0-7] | Out[n] = (actb[n] * synb[n]) >> shfamt |
| | 1 | Vec-scalar | Scalar | Shfamt Rng[0-7] | Out[n] = (actb[n] * Scalar) >> shfamt |
| 3: ACTIVATE | 0 | Reserved | Actdpos 0: q0 7: q7 | — | |
| | 1 | RELU | | | |
| | 2 | SIGMOID | | | |
| | 3 | TANH | | | |
| 4: EXMADD Extended Multiply Add | 0 | LMCX0 | — | Shfamt Rng[0-7] | Out0_16[n] = (outb16[n] * actb[n]) >> shfamt + synb[n] Out1_8[m] = tanh(Out0_16[n]) |
| | 1 | LMCX1 | | | Out_16[n] = (outb16[n] * actb[n]) >> shfamt + synb[n] |
| | 2 | M16_8_O16 | | | Out_16[n] = (outb16[n] * actb[n]) >> shfamt |
| | 3 | M16_8_O8 | | | Out_8[n] = (outb16[n] * actb[n]) >> shfamt |
| 5: MINMAX | 0 | MAX | — | — | If actb[n] > synb[n] outb[n] = actb[n] else outb[n] = synb[n] |
| | 1 | MIN | — | — | If actb[n] < synb[n] outb[n] = actb[n] else outb[n] = synb[n] |
| 6: NORM | 0 | Vec-vec | — | Shfamt Rng[0-7] | Out8[m] = ((out8[n] * actb[n]) >> shfamt) + synb[n] |
| | 1 | Vec-scalar | | | Out8[m] = ((out8[n0] * actb[n]) >> shfamt) + synb[n0] |

As shown in the table above, the combination of Func1 and Func2 determines which operation is performed by EWOP. For example, Func1 set to 0 indicates a saturating add (SADD), meaning the sum of vectors is saturated once the sum reaches a certain upper limit, instead of being allowed to overflow. When Func1 is set to 0, Func2 indicates which type of SADD is to be performed. For example, Func2 set to 0 indicates that operand one (OP1) and operand two (OP2) are both vectors. SADDs can also be performed between a vector and a scalar by setting Func2 to 1 or 2 depending on which operand is the scalar and which operand is the vector. Other operations supported by EWOP include saturating subtract (SSUB), multiply (MOLT), activate, extended multiply add (EXMADD), minmax, and normalization (NORM).

SSUB is similar to SADD and performs a subtraction between two vectors or between a vector and a scalar, where the result of the subtraction is saturated once the difference reaches a certain lower limit, thus preventing underflow.

MULT can be used to multiply a vector with a vector or scalar and then shift the product by an amount "shfamt."

Activate applies an activation function (e.g., ReLU, sigmoid, or Tanh) to an input vector.

EXMADD is typically performed in long short-term memory (LSTM) neural networks, which are a type of recurrent neural network.

Minmax locates the minimum and maximum values across two input vectors. Minmax can be used to implement a pooling operation typically performed in convolutional neural networks. In the example instruction set, EWOP does not support an explicit pooling operation, but the equivalent of pooling can be achieved using a series of Minmax operations.

NORM can be used to implement a normalization layer and performs what is known as batch normalization. Batch normalization involves normalizing a batch of data (in this example, data represented by a vector) based on its mean and standard deviation, followed by shifting and scaling using parameters learned across multiple batches.

SIGNAL

SIGNAL is used to set or clear the predicate register, either the entire predicate register or a particular flag bit, where the flag bit is identified according to an index value "pred_index." SIGNAL has the following fields:

signal <set|clear>, <all|pred_index>

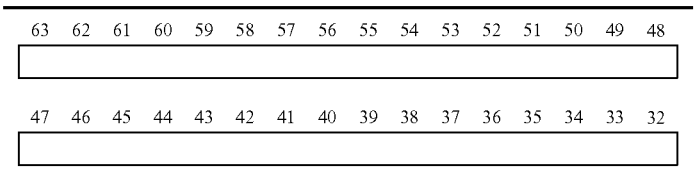

| 31 | 30 | 29 | 28 | 27 | 26 | 25 | 24 | 23 | 22 | 21 | 20 | 19 | 18 | 17 | 16 |
|---|---|---|---|---|---|---|---|---|---|---|---|---|---|---|---|
| | | | | | | | | | | | | | | | |

| 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|
| | | | pindex | | | | | A | SC | 00 | | | 0010 | | |

| Field | Description |
|---|---|
| SC | Set or Clear predicate<br>0 - Clear<br>1 - Set |
| A | If A is set, all fields of Predicate register are either cleared or set |
| pindex | Predicate Index |

HALT

HALT stops the execution of a context. Each context may comprise a set of instructions that ends with a HALT instruction. Upon executing the HALT instruction, an interrupt can generated to the host processor, thereby informing the host that the next context is ready to be executed. The generation of interrupts upon execution of HALT instructions can be enabled through a context configuration register (e.g., the context configuration register 422 of FIG. 4).

SETR

SETR sets a CDPR (e.g., one of the CDPRs 420 in FIG. 4) to an immediate value. SETR has the following fields:
setr <rindex>, <rvalue>

| 63 | 62 | 61 | 60 | 59 | 58 | 57 | 56 | 55 | 54 | 53 | 52 | 51 | 50 | 49 | 48 |
|---|---|---|---|---|---|---|---|---|---|---|---|---|---|---|---|
| | | | | | | | rvalue | | | | | | | | |

| 47 | 46 | 45 | 44 | 43 | 42 | 41 | 40 | 39 | 38 | 37 | 36 | 35 | 34 | 33 | 32 |
|---|---|---|---|---|---|---|---|---|---|---|---|---|---|---|---|
| | | | | | | | rvalue | | | | | | | | |

| 31 | 30 | 29 | 28 | 27 | 26 | 25 | 24 | 23 | 22 | 21 | 20 | 19 | 18 | 17 | 16 |
|---|---|---|---|---|---|---|---|---|---|---|---|---|---|---|---|
| | | | | | | | | | | | | | | | |

| 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|
| | | | | | | | rindex | | | 10 | | | 0010 | | |

| Field | Description |
|---|---|
| rindex | Index of CDPR Register |
| rvalue | 32-bit immediate value to written to the register |

When the register index "rindex" is set to 0, rvalue[3:0] is used to identify a field in the context configuration register to update. The rest of the values in the context configuration register are unchanged. An appropriate number of bits are used from rvalue[31:4] to update the field. As shown in the table below, SETR can be used to set the contents of the context configuration register to specify various parameters such as input scale factor, local memory buffer configurations, and interrupt enable.

| Rvalue[3:0] | Bit # | Context Configuration Field Description |
|---|---|---|
| 6 | 27:24 | Input Scale Factor |
| 5 | 23:22 | MBC—Memory Buffers Configuration |
| 4 | 21:8 | NI—Number of Instructions |
| 3 | 4:3 | IL—Interrupt pulse length |
| 2 | 2:2 | RP: Reset Performance Counters |
| 1 | 1:1 | IE: Interrupt Enable |
| 0 | 0:0 | LI: Load NNA Context Instructions from System Memory |

ADDR

ADDR adds one or more immediate values to a CDPR (e.g., one of the CDPRs 420 in FIG. 4). ADDR can perform subtraction when using signed immediate values. ADDR can be configured to add a 32-bit immediate value to the CDPR:

CDPR[rindex]=CDPR[rsrc]+imm

Alternatively, ADDR can split the 32-bit immediate value into two 16-bit immediate values for addition to corresponding halves of the CDPR:

CDPR[rindex][31:16]=CDPR[rsrc][31:16]+imm[31:16]

CDPR[rindex][15:00]=CDPR[rsrc][15:00]+imm[15:00]

| 63 | 62 | 61 | 60 | 59 | 58 | 57 | 56 | 55 | 54 | 53 | 52 | 51 | 50 | 49 | 48 |
|---|---|---|---|---|---|---|---|---|---|---|---|---|---|---|---|
| | | | | | | | imm | | | | | | | | |

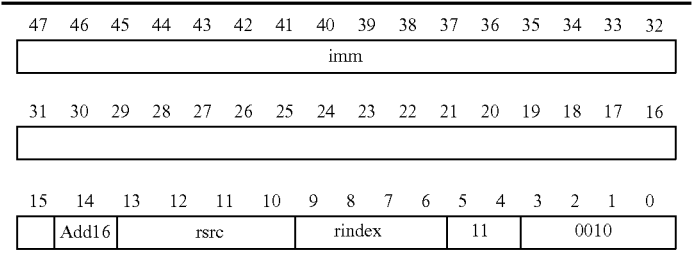

| Field | Description |
|---|---|
| rindex | Index of destination CDPR Register |
| Rsrc | Index of source CDPR Register |
| rvalue | 32-bit immediate value to written to the register |
| Add16 | 2x 16-bit add |

Extensible Instructions

The example instruction set above is non-exhaustive. The functionality of an instruction can be extended by using an extended version of the same instruction in combination with one or more auxiliary instructions. The extended version of the instruction can be formatted in the same way as the non-extended instruction. The presence of an extended instruction in program code indicates that the next instruction in the program code is an auxiliary instruction providing additional information needed to execute the extended instruction. Thus, the instruction set can be modified to add new functionality in order to support the operation of neural networks as neural networks continue to evolve.

Each instruction or extended instruction can be identified by a corresponding operational code (opcode), in the same manner as the instructions described above. For example, the instructions above are 64-bit instructions where the first four bits [3:0] correspond to an opcode. Thus, an extended instruction set could include the following opcodes:

| Instruction Name | Opcode - Lower 4 bits of Instruction[3:0] |
|---|---|
| LOAD | 0 |
| STORE | 1 |
| CTRL | 2 |
| PERCEPT | 3 |
| EWOP | 4 |
| LOADx | 8 |
| STOREx | 9 |
| PERCEPTx | 11 |
| EWOPx | 12 |

In the table above, the extended instructions are labeled with an "x", e.g., LOADx, PERCEPTx, and EWOPx. Not every instruction may have an extended counterpart. Extended instructions can be used when the information needed to indicate the operation to be performed cannot fit within the width of a single instruction (e.g., 64 bits).

As an example, in some instances, it may be useful to perform a load that creates margins around the data being loaded. The data could be a 2D matrix and the margins could be created by appending zeroes or some other value around the borders of the matrix (e.g., to the left of the first column, to the right of the last column, above the first row, and below the last row). To perform this type of load, a LOADx can be used in combination with an auxiliary instruction, where the fields of the LOADx are set in the same way as a regular LOAD, and where the auxiliary instruction indicates how the data will be padded. Thus, the program code may comprise:

LOADx . . . .

AUX0 pad_top, pad_bottom, pad_left, pad_right where " . . . " represents the same fields that would have been set had the data been loaded using the regular LOAD instruction, and where pad_top, pad_bottom, pad_left, pad_right are fields that respectively indicate the amount of padding to add to the top, bottom, left, and right of the data.

In the example above, the presence of the LOADx instruction indicates that the immediately following instruction (AUX0) is an auxiliary instruction. A particular bit (e.g., the first bit) of an auxiliary instruction can be set to indicate whether the auxiliary instruction is the last auxiliary instruction for the preceding extended instruction. For example, setting the first bit to 0 (as in the load example above) may indicate the last auxiliary instruction, and setting the first bit to 1 may indicate that additional auxiliary instructions follow. In this manner, as many auxiliary instructions as needed to supply the information for an extended instruction can be added to an instruction chain that begins with the extended instruction. Such chaining overcomes the problem of limited instruction width.

NNA Context Assembly Instructions—Example with PERCEPT

The following is a set of example assembly instructions generated by a compiler for an NNA context:

add r6, r2, 0x0
add r7, r4, 0x80
add r8, r4, 0x0
add r9, r3, 0x0
Input=128 Output=128 Act=2 actb_addr=1 synb_addr=1 ivlb_addr=0 outb_addr=1 isfv=0 ivsl=7 mbi=0
gpr_act=6 gpr_syn=7 gpr_ivl=8 gpr_out=9 gpr_temp=14
adpos=14 odpos=4 out32b=0
setr r14, 0x0
setr r15, 0x0
pred_in,pred_out,g_src_adr,dst_addr,size,dst_mem, mode,elm_sz
load pnone,pnone,r6,0, 15, 0, 0, 5←Start the load unconditionally (pnone) and finish without setting a predicate bit (pnone)
pred_in,pred_out,g_src_adr,dst_addr,size,dst_mem, mode,elm_sz
load pnone,pnone,r8,0, 15, 4, 0, 5
pred_in,pred_out,g_src_adr,dst_addr, size, dst_mem, mode,elm_sz
load pnone,0,r7,0, 2047, 2, 1, 5. ←Start the load unconditionally (pnone) and finish with setting the predicate bit 0
pred_in,pred_out,size,g_adr_base,isfv,ivsl,osf,mbi,nlin, acc_init,acc_out,odpos,adpos,rp percept 0, 16, 15, r14, 0, 7, 0, 0, 2, 1, 0, 4, 14, 15←Start the percept instruction only when predicate bit 0 is set and set predicate bit 16 upon completion
    #pred_in,pred_out,g_dst_adr,src_addr,size,src_mem
    store 16,pnone,r9, 0, 15, 4←Start the store only when predicate 16 is set
    signal clear, all
    #---- Fragment end ----
    halt The four add instructions at the beginning of the code are for setting up pointers to the addresses of where the data buffers are in located in memory. For example, at compile time, an activation buffer "gpr_act" is set to register "r6", a synaptic weight buffer "gpr_syn" set to register "r7", an initial value buffer "gpr_ivl" set to register "r8", and an output buffer "gpr_out" set to register "r9", with the addresses stored in registers r6, r7, r8, and r9 being modified at runtime based on offsets introduced by the four add instructions.

In the example code above, the first and second load instructions have their pred_in and pred_out fields set to "pnone," meaning the loads can start and finish unconditionally. The third load starts unconditionally (pred_in=pnone) and sets predicate bit 0 (pred_out=0) upon completion of execution. The first load is for loading activations, the second load for bias values, and the third load for weights. Because the loads for a neural network typically involve large quantities of data, the three loads could take many (e.g., hundreds) of clock cycles to complete. Notice that the PERCEPT instruction that follows the third load is predicated to start upon predicate bit 0 being set. Thus, the PERCEPT instruction will wait until the third load finishes before starting. Additionally, the PERCEPT instruction sets predicate bit 16 upon completion, with the STORE instruction that follows being predicated to start upon predicate bit 16 being set. Thus, the STORE instruction will wait until the PERCEPT instruction finishes.

Context Execution and Example Computing System

Figure 5:
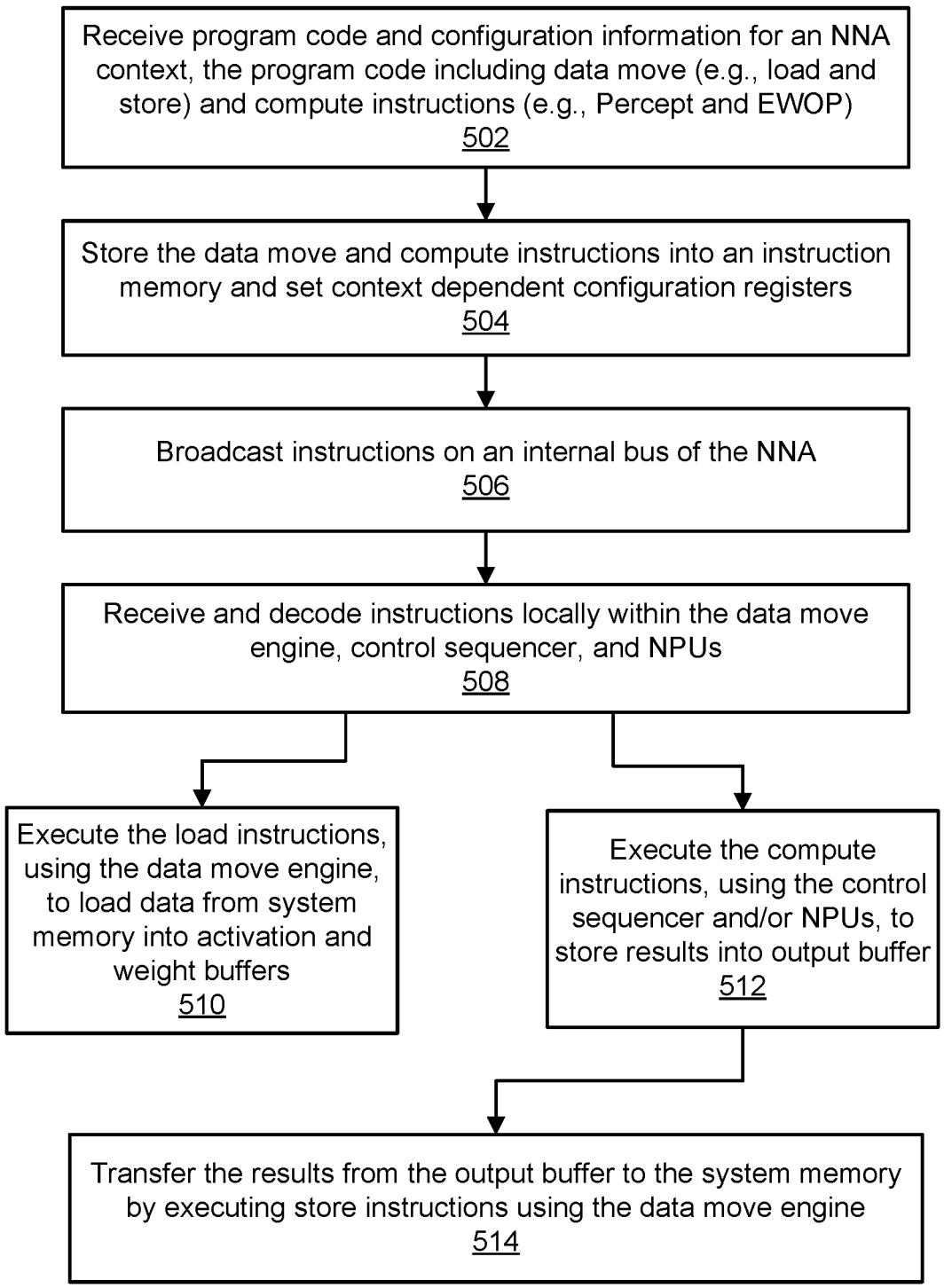
FIG. 5 illustrates an example process for executing instructions within a neural network accelerator, according to certain embodiments.

FIG. 5 is a flow diagram of an example process 500 for executing an NNA context, according to certain embodiments. The process 500 can be performed by the NNA 100 in FIG. 1. At block 502, the NNA receives program code and configuration information for a context. As explained earlier, a context can correspond to complete layer, a partial layer, or multiple layers of a neural network. The program code is compiled code that includes data move instructions and compute instructions. An example of such program code was provided above in the section on NNA Context Assembly Instructions. In most instances, the program code is received from a host processor, e.g., through the host interface 110. Alternatively, program code can be received from the system memory, e.g., via the DME 150.

Data move instructions involve loading data used by the compute instructions from the host or system memory into activation and weight buffers. Data move instructions also involve storing intermediate and/or final results produced by compute instructions, for example, transferring final results stored in an output buffer to the system memory. Compute instructions involve data processing performed upon data loaded into the activation and weight buffers. As mentioned earlier, activation, weight, and output buffers can be implemented using local memory buffers (e.g., the local memory buffers 140) that are accessed using corresponding access units (e.g., access units 120, 122, and 130).

The configuration information received along with the program code at block 502 can include settings for various context dependent parameter registers. The configuration information can be received as part of the program code (e.g., in one or more SETR instructions) or sent separately to the NNA (e.g., sent from the host in the form of device driver code).

At block 504, the data move and compute instructions are stored in an instruction memory, e.g., the instruction memory of the control sequencer 112. If the program code was received by the DME in block 502, the DME can forward the instructions to the control sequencer for storage. In addition to storing the instructions, block 504 may involve setting one or more context dependent configuration registers according to the configuration information received at block 502.

At block 506, the instructions are broadcast by the control sequencer through an internal bus of the NNA for asynchronous execution by any processing component (e.g., the control sequencer, the DME, or the NPUs) that can handle the instructions. For example, each NPU can be configured to, in response to detecting that a PERCEPT instruction has been broadcast, execute a particular stage of the PERCEPT instruction. In certain embodiments, a processing component will, upon determining that it can handle an instruction, broadcast a response to indicate to the other processing components that the instruction is being handled.

At block 508, the instructions are received and decoded locally with the DME, the control sequencer, and the NPUs to determine whether the instructions can be handled by any of these components. The control sequencer may already have a copy of the instructions at this time since the instructions were stored in the instruction memory at block 504.

At block 510, load instructions are executed using the DME, which obtains activation and weight data from system memory and copies this data into the activation and weight buffers.

At block 512, compute instructions are executed using the control sequencer and/or NPUs. Typically, most compute instructions are handled by NPUs, with the control sequencer handling a small subset of the compute instructions (e.g., instructions involving computations that are not data intensive). The control sequencer may also handle instructions that do not involve computations, such as the HALT instruction described earlier.

At least some of the compute instructions executed at block 512 may depend on the data loaded at block 510. Because instructions are executed asynchronously, their clock cycles may overlap. For instance, a LOAD instruction executed by the DME at block 510 could be executed concurrently with a PERCEPT or EWOP instruction at block 512 that depends on activations or weights provided by the LOAD instruction. The synchronization mechanism described earlier enables the instructions to execute in proper sequence. Additionally, the processing depicted in FIG. 5 can be performed concurrently on multiple NNAs, in which case the synchronization mechanism could be used to synchronize execution of instructions from different contexts.

To obtain the data from local memory buffers for use by the control sequencer or NPUs at block 512, activation and weight buffer access units (e.g., the access units 120 and 122) can send requests to the local memory buffers in advance of when the data is needed by the control sequencer or NPUs. The activation and weight buffer access units may have also received the instructions broadcast in block 506, and can therefore decode the compute instructions to determine what data is needed and the addresses of this data in the local memory buffers. Further, the activation and weight buffer access units can monitor the status of the predicate register to synchronize access to the activation and weight buffers according to any predicate conditions specified in the compute instructions.

At least some of the results computed at block 512 are stored in an output buffer of the local memory buffers. For example, in FIG. 3, the final result of a PERCEPT instruction may be computed by the NPU 128 and sent to the output buffer access unit 130 for transmission to an output buffer in the local memory buffers 140.

At block 514, the results stored in the output buffer are transferred to system memory by executing STORE instructions using the DME. The synchronization mechanism also applies here since STORE instructions may be predicated to begin upon completion of compute instructions. Upon completion of the final instruction of the context (e.g., a HALT instruction), the instructions for the next context to be executed can be loaded. Additionally, as explained earlier, an interrupt may be generated to the host processor.

Figure 6:
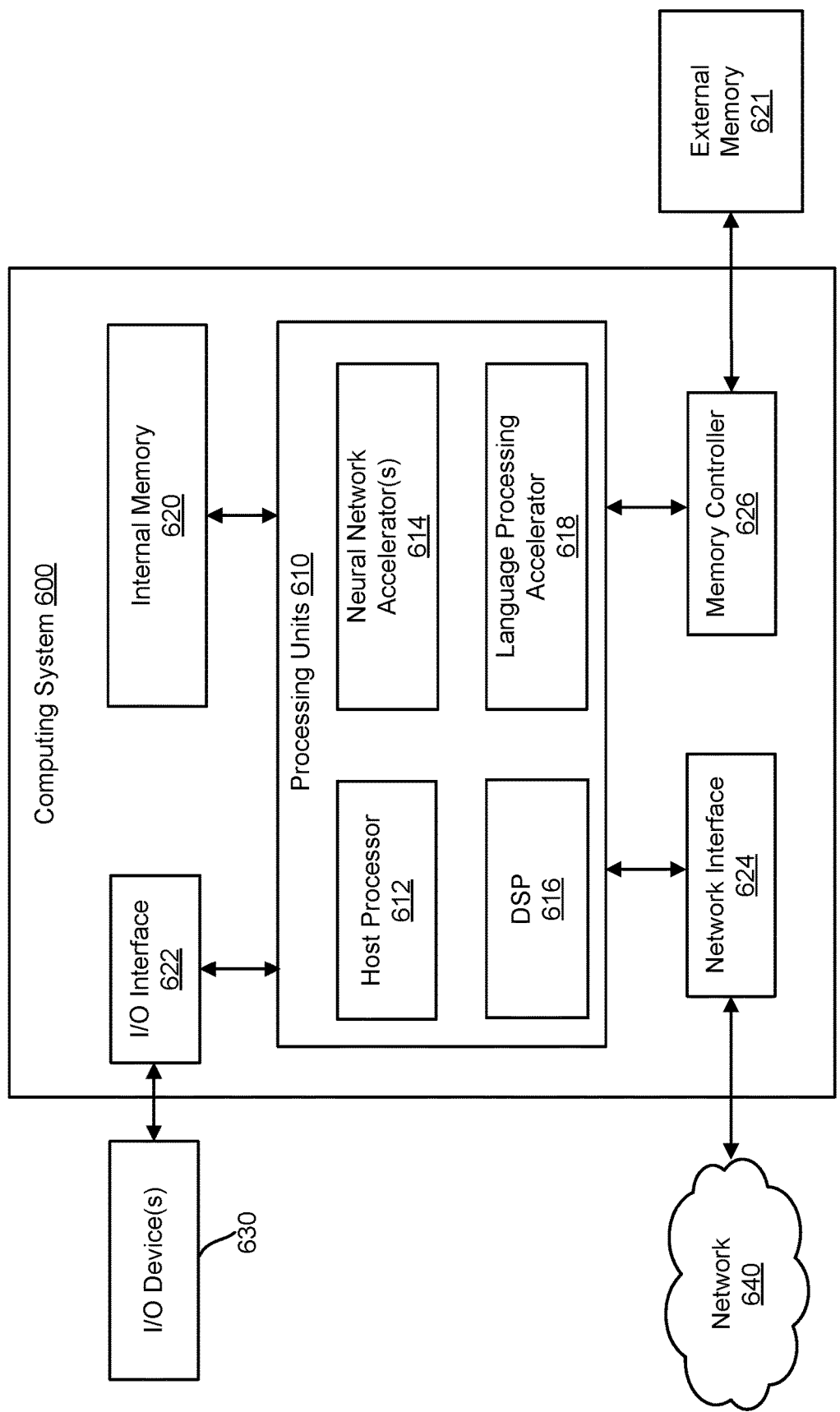
FIG. 6 illustrates an example of a computing system in which the neural network accelerator of FIG. 1 can be used.

FIG. 6 is a simplified block diagram of an example computing system 600 in which the NNA 100 of FIG. 1 can be used. In some examples, the computing system 600 can be used to implement a special purpose computing system for executing neural networks in connection with specific types of applications. For example, the computing system 600 may implement a computing device that processes speech input through NNA 100 to provide an intelligent virtual assistant that performs various tasks on behalf of a user, such as home automation, playing audio or visual media, and placing online orders for products or services. Alternatively, the computing system 600 can be used to implement a general purpose computer that also has neural network capabilities. In certain embodiments, the computing system 600 is implemented as a system-on-chip (SoC).

The example computing system 600 of FIG. 6 includes a set of processing units 610, an internal memory 620, an external memory 621, an Input/Output (I/O) interface 622, and a network interface 624. The processing units 610 can include a host processor 612, an NNA 614, a digital signal processor (DSP) 616, a language processing accelerator 618, and a memory controller 626. The computing system 600 can further include one or more busses (not depicted) that enable the various components of the computing system 600 to communicate with one another. In various implementations, the computing system 600 can include other hardware that is not illustrated here.

The host processor 612 can be a general purpose integrated circuit that is capable of executing program instructions. In some examples, the host processor 612 can include multiple processing cores. In a multi-core processor, each core may be able to independently execute program code. As part of executing its own program code, the host processor 612 may generate program code (e.g., an NNA context) for execution on NNA 614. For example, host processor 612 may execute a software compiler stored in the internal memory 620 or the external memory 621 to produce compiled program code and device driver code for transmission to NNA 614. In certain embodiments, the computing system 600 can include more than one host processor 612, each host processor being capable of acting as the host for NNA 614.

The NNA 614 can be implemented using the NNA 100 in FIG. 1 and is configured to execute contexts on behalf of the host processor 612. The processing units 610 can include multiple NNAs 614 configurable to run contexts simultaneously, e.g., contexts for different portions of the same neural network or for different neural networks.

The DSP 616 can perform digital signal processing to prepare data for processing by other processing units such as the NNA 614 or the language processing accelerator 618. In some embodiments, the DSP 616 may condition and convert analog audio signals into digital data, where the audio signals are generated by one or more microphones included in I/O devices 630.

The language processing accelerator 618 can perform language processing including, for example, speech recognition. In certain embodiments, the language processing accelerator 618 implements a Weighted Finite-State Transducers (WFST) based language model for speech recognition. However, the language processing accelerator 918 can also implement other language models in addition, or as an alternative, to the WFST based language model. The language processing accelerator 618 can work in conjunction with the NNA 614 and the DSP 616 to perform language processing. For example, an audio frame from a microphone may be processed by DSP 616 to extract audio features (e.g., using a Fast Fourier Transform or other signal analysis techniques) in the form of a feature vector for input to an acoustic model. The acoustic model may be implemented by a neural network executed within the NNA 614, and may infer the probability that the audio frame corresponds to particular words or parts of speech (e.g., one or more phonemes). The probabilities computed by the acoustic model can then be input to the language processing accelerator 618 to decode the audio frame into text.

The internal memory 620 and the external memory 621 collectively form the system memory of the computing system 600. The system memory can include memory used for storage of program code executed by the host processor 612, the NNA 614, and/or any of the other processing units 610. For example, the system memory can include an operating system, software applications executed by the host processor 612 within an environment provided by the operating system, device driver code (e.g., for configuring an NNA context or for controlling the I/O devices 630), program code for an NNA context, storage space for data being operated on or produced by the host processor 612, storage space for activations and weights for loading into the NNA 614, storage space for results computed by NNA 614, and storage space for data being operated on or produced by the language processing accelerator 618. The operating system within the system memory can coordinate the activities of the hardware of the computing system 600, as well as the activities of any software applications or device drivers. For example, the operating system can perform operations such as scheduling NNA contexts, executing applications, or controlling peripheral devices (e.g., the I/O devices 630). The system memory can be implemented using volatile memory types (such as Random Access Memory (RAM) type memories) and/or non-volatile memory types (such as Read-Only Memory (ROM), flash memory, etc.).

The above described data of the system memory can be distributed between the internal memory 620 and the external memory 621 in any fashion. For example, the internal memory 620 may store the operating system, device driver code, program code for an NNA context, and software applications, while the external memory 621 stores activations, weights, and results computed by the NNA 614. In some embodiments, both the internal memory 620 and the external memory 621 may store data used by the NNA 614.

The memory controller 626 is configured to transfer data between the external memory 621 and the processing units 610. For example, if the data coming into the DME 150 of FIG. 1 is provided by the external memory 621, the memory controller 626 may read the data out of the external memory 621 and into the DME 150. In certain embodiments, the external memory 621 is implemented as Dynamic Random Access Memory (DRAM), and the memory controller 626 is a DRAM controller. However, the external memory 621 can be implemented with other types of memory besides DRAM, e.g., flash memory, SRAM, etc.

The I/O devices 630 can include hardware that adds functionality to the computing system 600. For example, the I/O devices 638 can include non-volatile storage devices, such as solid state drives, magnetic drives, optical drives, and/or tape drives, among other examples. The I/O devices 630 can further include devices for receiving input from or providing output to a user, such as keyboards, display monitors, audio speakers, and microphones.

The network interface 624 can enable the computing system 600 to communicate with a network 640 or with multiple networks. The network interface 624 can include, for example, one or more network interface cards (NICs). The network interface 624 can include a physical port for connecting to a wired network. Alternatively or additionally, the network interface 624 can include an antenna for connecting to a wireless network. In some examples, the network interface 624 includes more than one physical port, and/or more than one antenna, so that the computing system 600 can communicate with multiple networks at the same time.

The system memory (internal memory 620 and external memory 621), storage devices, and other memories discussed above are examples of computer-readable media. Other examples of computer-readable media include removable storage devices, such as magnetic tapes, floppy disks, Compact Discs (CDs), Digital Versatile Discs (DVDs), Blue-Ray disks, and flash memory drives, among other examples. In each of these examples, the computer-readable medium is capable of storing program code that can be executed by one or more of the processing units 610. In some cases, the computer-readable medium may be non-transitory, meaning that the data stored on the computer-readable medium remains stored on the medium when power is not applied to the computer readable medium. Examples of non-transitory computer-readable media include ROM-based memory, hard disks, removable disks such as those listed above, and flash-based memory, among other examples.

Although specific embodiments have been described, various modifications, alterations, alternative constructions, and equivalents are possible. Various features and aspects of the above-described embodiments may be used individually or jointly. The specification and drawings are, accordingly, to be regarded in an illustrative rather than a restrictive sense. It will, however, be evident that various modifications and changes may be made thereunto without departing from the broader spirit and scope of the disclosure as set forth in the claims. Further, while certain embodiments have been described using a particular combination of hardware and software, it should be recognized that other combinations of hardware and software are also possible.

The use of the terms "a" and "an" and "the" and similar referents in the context of describing the disclosed examples (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening. Recitation of ranges of values herein are merely intended to serve as a shorthand method of referring individually to each separate value falling within the range, unless otherwise indicated herein and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate examples of the disclosure and does not pose a limitation on the scope of the disclosure unless otherwise claimed. No language in the specification should be construed as indicating any non-claimed element as essential to the practice of the disclosure.

Disjunctive language such as the phrase "at least one of X, Y, or Z," unless specifically stated otherwise, is intended to be understood within the context as used in general to present that an item, term, etc., may be either X, Y, or Z, or any combination thereof (e.g., X, Y, and/or Z). Thus, such disjunctive language is not generally intended to, and should not, imply that certain examples require at least one of X, at least one of Y, or at least one of Z to each be present.

Various embodiments of this disclosure are described herein. Variations of those embodiments may become apparent to those of ordinary skill in the art upon reading the foregoing description. The inventors expect skilled artisans to employ such variations as appropriate and the inventors intend for the disclosure to be practiced otherwise than as specifically described herein. Accordingly, this disclosure includes all modifications and equivalents of the subject matter recited in the claims appended hereto as permitted by applicable law. Moreover, any combination of the above-described elements in all possible variations thereof is encompassed by the disclosure unless otherwise indicated herein or otherwise clearly contradicted by context.

What is claimed is:

1. A computing system, comprising:
a neural network processor including a control sequencer and a plurality of processing units, the plurality of processing units comprising a first processing unit and a second processing unit; and
a memory storing program code for a neural network, the program code comprising a first instruction, a second instruction, and a third instruction;
wherein the control sequencer is configured to broadcast the first instruction to each of the first processing unit and the second processing unit;
wherein the first processing unit is configured to generate a set of products, wherein each product from the set of products is a result of multiplying a weight from a first set of weights with a value from a first set of values, and send the set of products to the second processing unit;
wherein the second processing unit is configured to generate a summed value by adding together all products from the set of products, wherein the summed value represents an output activation of the neural network;
wherein the neural network processor is configured to:
determine, from an operational code of the second instruction, that the second instruction is immediately followed in the program code by the third instruction;
obtain information from the third instruction; and
execute the second instruction using the information.

2. The computing system of claim 1, further comprising:
a predicate register including a plurality of bits, each bit being settable to a first value, wherein:
the first instruction includes first information indicating that execution of the first instruction is conditioned upon a first bit from the plurality of bits being set to the first value;
the first processing unit is configured to postpone generating the set of products until the first bit is set to the first value; and
the first bit is set to the first value upon completion of the second instruction.

3. The computing system of claim 1, further comprising:
a predicate register including a plurality of bits, each bit being settable to a first value, wherein:
the first instruction includes first information indicating that a first bit from the plurality of bits will be set to the first value upon completion of the first instruction; and
execution of the second instruction by the neural network processor is conditioned upon the first bit being set to the first value.

4. The computing system of claim 1, wherein:
each weight from the first set of weights represents a weight of the neural network, and each value from the first set of values represents a value produced by a first activation function of the neural network; and
the first instruction includes (i) first information indicating a decimal position of the summed value or (ii) second information indicating a decimal position of an output value to which the summed value is mapped using a second activation function.

5. The computing system of claim 1, wherein the first instruction includes (i) first information indicating a number of bits in each weight from the first set of weights or (ii) second information indicating a number of bits in each value from the first set of values.

6. The computing system of claim 1, wherein:
each weight from the first set of weights represents a weight of the neural network, and each value from the first set of values represents a value produced by a first activation function of the neural network; and
the neural network processor further comprises a third processing unit configured to generate an output value using a second activation function, the second activation function mapping the summed value to the output value, and the output value representing an output of a node of the neural network.

7. The computing system of claim 1, wherein:
each weight from the first set of weights represents a weight of the neural network, and each value from the first set of values represents a value produced by a first activation function of the neural network;
the neural network processor further comprises a third processing unit configured to generate an output value using a second activation function, the second activation function mapping the summed value to the output value, and the output value representing an output of a node of the neural network;
the first instruction includes first information indicating a scale factor; and
to generate the output value, the third processing unit scales the summed value according to the scale factor.

8. The computing system of claim 1, wherein the program code further comprises a fourth instruction, and wherein the neural network processor is configured to generate, in response to receiving the fourth instruction, an output vector from a first vector and a second vector, wherein the first vector comprises first ordered elements corresponding to one of a second set of weights, a second set of values, or multiple instances of a same scalar value, wherein the second vector comprises second ordered elements corresponding to a different one of the second set of weights, the second set of values, or the multiple instances of the same scalar value, and wherein to generate the output vector, the neural network processor is configured to:
determine, from information included in the fourth instruction, an operation; and
perform the operation on different pairs of ordered elements, each pair of ordered elements comprising an element from the first ordered elements and a corresponding element from the second ordered elements.

9. The computing system of claim 8, wherein the operation is one of the following:
a saturating addition in which a first sum of a first ordered element from the first vector and a second ordered element from the second vector is limited to a maximum value;
a saturating subtraction in which in a difference between the first ordered element and the second ordered element is limited to a minimum value;
a multiplication in which the first ordered element is multiplied with the second ordered element; or
an extended multiply add in which the first ordered element is summed with the second ordered element to produce a second sum, the first ordered element being a weight from the second set of weights, and the second ordered element being a value from the second set of values, and the second sum is multiplied with a third ordered element from a third vector representing a third set of values.

10. The computing system of claim 8, wherein the information included in the fourth instruction comprises first information identifying the operation and second information indicating whether the first vector or the second vector includes the same scalar value.

11. The computing system of claim 1, wherein the neural network processor is further configured to:
determine, based on a bit in the third instruction being set to a first value, that no additional instructions are included in an instruction chain that includes the second instruction and the third instruction.

12. A method, comprising:
receiving, by a neural network processor, program code comprising a first instruction, a second instruction, and a third instruction, the first instruction including a first operational code that identifies the first instruction;
executing, by the neural network processor, the first instruction, wherein executing the first instruction comprises:
determining, from a base address included in the first instruction, a first location where a first set of weights are stored in a memory of the neural network processor;
determining, from the base address, a second location where a first set of values are stored in the memory;
retrieving the first set of weights and the first set of values from the memory;
broadcasting the first instruction to each of a first processing unit and a second processing unit of the neural network processor;
generating, by the first processing unit, a set of products, wherein each product from the set of products is a result of multiplying a weight from the first set of weights with a value from the first set of values;
generating, by the second processing unit, a summed value by adding together all products from the set of products, wherein the summed value represents an output activation of a neural network;
determining, by the neural network processor, that the second instruction is immediately followed in the program code by the third instruction from an operational code of the second instruction;
obtaining, by the neural network processor, information from the third instruction; and
executing, by the neural network processor, the second instruction using the information.

13. The method of claim 12, wherein the program code further comprises a fourth instruction including a second operational code different from the first operational code, the method further comprising:
executing, by the neural network processor, the fourth instruction, wherein executing the fourth instruction comprises:
determining, from information included in the fourth instruction, a first operation to be performed on a first vector and a second vector, wherein the first vector comprises first ordered elements corresponding to one of a second set of weights or a second set of values, wherein the second vector comprises second ordered elements corresponding to a different one of the second set of weights or the second set of values; and
performing the first operation on first pairs of ordered elements, each pair of ordered elements from the first pairs of ordered elements comprising an ordered element from the first vector and a corresponding ordered element from the second vector, wherein performing the first operation comprises:
summing a first ordered element from the first vector and a second ordered element from the second vector;
subtracting the first ordered element from the second ordered element; or
multiplying the first ordered element with the second ordered element.

14. The method of claim 13, wherein the program code further comprises a fifth instruction including the second operational code, the method further comprising:
executing, by the neural network processor, the fifth instruction, wherein executing the third instruction comprises:
determining, from information included in the fifth instruction, a second operation to be performed on a third vector and a scalar value, wherein the third vector comprises third ordered elements corresponding to one of a third set of weights or a third set of values;
forming a fourth vector comprising fourth ordered elements, each ordered element of the fourth ordered elements being the scalar value; and
performing the second operation on second pairs of ordered elements, each pair of ordered elements from the second pairs of ordered elements comprising an ordered element from the third vector and a corresponding ordered element from the fourth vector, wherein performing the second operation comprises:
summing a third ordered element from the third vector and a fourth ordered element from the fourth vector;
subtracting the third ordered element from the fourth ordered element;
subtracting the fourth ordered element from the third ordered element; or
multiplying the third ordered element with the fourth ordered element.

15. The method of claim 12, further comprising:
identifying, by the neural network processor, a first bit in a predicate register, wherein the first bit is indicated by first information included in the first instruction; and
postponing executing the first instruction until the first bit has been set to a first value, wherein the first bit is set to the first value by a fourth instruction executed by the neural network processor or a different neural network processor; or
setting the first bit to the first value after executing the first instruction, wherein execution of the fourth instruction is postponed until the first bit has been set to the first value.

16. The method of claim 12, further comprising:
determining, by the neural network processor, a first scale factor by which the first set of weights or the first set of values were scaled, wherein the first scale factor is indicated by first information included in the first instruction; and
generating an output value using a third processing unit, wherein generating the output value comprises:
generating a scaled sum by scaling the summed value according to a second scale factor that is an inverse of the first scale factor; and
mapping the scaled sum to the output value according to a second activation function, wherein each value from the first set of values represents a value produced by a first activation function of the neural network.

* * * * *